United States Patent
Kim

(10) Patent No.: US 9,673,198 B2
(45) Date of Patent: Jun. 6, 2017

(54) SEMICONDUCTOR DEVICES HAVING ACTIVE REGIONS AT DIFFERENT LEVELS

(71) Applicant: Juyoun Kim, Suwon-si (KR)

(72) Inventor: Juyoun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 14/682,372

(22) Filed: Apr. 9, 2015

(65) Prior Publication Data

US 2016/0104708 A1    Apr. 14, 2016

(30) Foreign Application Priority Data

Oct. 10, 2014 (KR) ................. 10-2014-0136844

(51) Int. Cl.
| | | |
|---|---|---|
| H01L 27/092 | (2006.01) | |
| H01L 29/10 | (2006.01) | |
| H01L 29/06 | (2006.01) | |
| H01L 21/8234 | (2006.01) | |

(52) U.S. Cl.
CPC ...... *H01L 27/0924* (2013.01); *H01L 29/0692* (2013.01); *H01L 29/1037* (2013.01); *H01L 21/823412* (2013.01); *H01L 21/823431* (2013.01); *H01L 21/823481* (2013.01)

(58) Field of Classification Search
CPC ............ H01L 27/0924; H01L 27/0928; H01L 29/41791; H01L 29/0684–29/0696; H01L 29/1037
See application file for complete search history.

(56) References Cited

U.S. PATENT DOCUMENTS

| | | | |
|---|---|---|---|
| 6,800,512 B1 * | 10/2004 | Itonaga | H01L 21/02238 257/E21.258 |
| 6,800,910 B2 | 10/2004 | Lin et al. | |
| 6,885,055 B2 | 4/2005 | Lee | |
| 7,045,401 B2 | 5/2006 | Lee et al. | |
| 7,060,539 B2 | 6/2006 | Chidambarrao et al. | |
| 7,067,868 B2 | 6/2006 | Thean et al. | |
| 7,224,033 B2 | 5/2007 | Zhu et al. | |
| 7,247,912 B2 | 7/2007 | Zhu et al. | |
| 7,304,336 B2 | 12/2007 | Cheng et al. | |
| 7,314,802 B2 | 1/2008 | Zhu et al. | |
| 7,348,225 B2 | 3/2008 | Zhu | |
| 7,425,740 B2 | 9/2008 | Liu et al. | |
| 7,470,951 B2 | 12/2008 | Mathew et al. | |
| 7,705,345 B2 | 4/2010 | Bedell et al. | |
| 7,719,059 B2 * | 5/2010 | Hofmann | H01L 21/845 257/347 |
| 7,749,842 B2 | 7/2010 | Zhu et al. | |
| 7,759,737 B2 | 7/2010 | Cho et al. | |

(Continued)

*Primary Examiner* — Joshua King
(74) *Attorney, Agent, or Firm* — Myers Bigel, P.A.

(57) ABSTRACT

A semiconductor device has active regions with different conductivity types. A substrate has a PMOS region and an NMOS region. A first active region is in the PMOS region. A second active region is in the NMOS region. A semiconductor layer is on the first active region. A first gate electrode crosses the first active region and extends on the semiconductor layer. A second gate electrode is on the second active region. An upper end of the first active region extends to a level lower than an upper end of the second active region. A lower end of the first active region extends to a level lower than a lower end of the second active region.

20 Claims, 23 Drawing Sheets

(56) References Cited

U.S. PATENT DOCUMENTS

| | | |
|---|---|---|
| 7,910,413 B2 | 3/2011 | Zhu |
| 7,993,999 B2 | 8/2011 | Basker et al. |
| 8,039,843 B2 | 10/2011 | Inaba |
| 8,138,543 B2 | 3/2012 | Cheng et al. |
| 8,159,018 B2 | 4/2012 | Akil et al. |
| 8,169,024 B2 | 5/2012 | Cheng et al. |
| 8,183,627 B2 | 5/2012 | Currie |
| 8,227,316 B2 | 7/2012 | Zhu et al. |
| 8,264,032 B2 | 9/2012 | Yeh et al. |
| 8,552,477 B2 | 10/2013 | Zhu |
| 8,598,595 B2 | 12/2013 | Zhu et al. |
| 8,653,610 B2 | 2/2014 | Jagannathan et al. |
| 8,729,607 B2 | 5/2014 | Itokawa et al. |
| 8,729,627 B2 | 5/2014 | Cheng et al. |
| 8,729,638 B2 | 5/2014 | Zhu et al. |
| 8,748,993 B2 | 6/2014 | Lee et al. |
| 2004/0195624 A1 | 10/2004 | Liu et al. |
| 2004/0245579 A1* | 12/2004 | Ohmi ............... H01L 21/82380 257/376 |
| 2005/0199919 A1* | 9/2005 | Liu .................. H01L 29/66795 257/288 |
| 2005/0224800 A1* | 10/2005 | Lindert ............ H01L 29/66795 257/66 |
| 2005/0239242 A1* | 10/2005 | Zhu ..................... H01L 21/845 438/199 |
| 2006/0076625 A1 | 4/2006 | Lee et al. |
| 2006/0113603 A1 | 6/2006 | Currie |
| 2006/0157687 A1* | 7/2006 | Doyle .............. H01L 29/66795 257/19 |
| 2006/0197129 A1 | 9/2006 | Wohlmuth |
| 2008/0128797 A1* | 6/2008 | Dyer ..................... H01L 29/785 257/328 |
| 2008/0230852 A1* | 9/2008 | Yu .................... H01L 21/82343 257/401 |
| 2008/0274594 A1* | 11/2008 | Karve .............. H01L 21/76283 438/153 |
| 2009/0218632 A1* | 9/2009 | Cheng .............. H01L 21/82380 257/369 |
| 2009/0289304 A1 | 11/2009 | Pouydebasque et al. |
| 2010/0155843 A1 | 6/2010 | Mayer et al. |
| 2011/0227162 A1 | 9/2011 | Lin et al. |
| 2011/0303981 A1 | 12/2011 | Edge et al. |
| 2012/0032732 A1 | 2/2012 | Xiao et al. |
| 2012/0187418 A1 | 7/2012 | Yin et al. |
| 2012/0248544 A1 | 10/2012 | Yokoyama |
| 2012/0306002 A1 | 12/2012 | Yeh et al. |
| 2013/0062699 A1* | 3/2013 | Zhu .................. H01L 29/66795 257/368 |
| 2013/0137256 A1* | 5/2013 | Tsai ................. H01L 29/66545 438/585 |
| 2013/0154016 A1 | 6/2013 | Glass et al. |
| 2013/0175618 A1* | 7/2013 | Cheng .............. H01L 21/82343 257/347 |
| 2013/0181297 A1 | 7/2013 | Liaw |
| 2013/0187129 A1 | 7/2013 | Cheng et al. |
| 2013/0193482 A1 | 8/2013 | Hekmatshoartabari et al. |
| 2013/0196488 A1 | 8/2013 | Hekmatshoartabari et al. |
| 2013/0200433 A1 | 8/2013 | Adam et al. |
| 2013/0200454 A1 | 8/2013 | Anderson et al. |
| 2013/0200459 A1 | 8/2013 | Adam et al. |
| 2013/0228825 A1 | 9/2013 | Xu |
| 2013/0234203 A1 | 9/2013 | Tsai et al. |
| 2013/0240989 A1 | 9/2013 | Glass et al. |
| 2013/0248999 A1 | 9/2013 | Glass et al. |
| 2013/0264639 A1 | 10/2013 | Glass et al. |
| 2013/0270512 A1* | 10/2013 | Radosavljevic .. H01L 21/82380 257/9 |
| 2013/0270628 A1 | 10/2013 | Huang et al. |
| 2013/0270638 A1 | 10/2013 | Adam et al. |
| 2013/0270641 A1 | 10/2013 | Chi |
| 2013/0270652 A1 | 10/2013 | Liaw |
| 2013/0285153 A1 | 10/2013 | Lee et al. |
| 2013/0292777 A1 | 11/2013 | Liaw |
| 2014/0001520 A1 | 1/2014 | Glass et al. |
| 2014/0027816 A1 | 1/2014 | Cea et al. |
| 2014/0054546 A1 | 2/2014 | Liu et al. |
| 2014/0054547 A1 | 2/2014 | Eneman et al. |
| 2014/0084351 A1 | 3/2014 | Huang et al. |
| 2014/0103397 A1 | 4/2014 | Pillarisetty et al. |
| 2014/0124860 A1* | 5/2014 | Cheng ................. H01L 21/845 257/347 |
| 2014/0284723 A1* | 9/2014 | Lee ....................... H01L 21/76 257/369 |
| 2015/0187766 A1* | 7/2015 | Basker ............... H01L 27/0886 257/365 |
| 2015/0325572 A1* | 11/2015 | Cheng ................. H01L 21/762 257/369 |

* cited by examiner

SEMICONDUCTOR DEVICES HAVING ACTIVE REGIONS AT DIFFERENT LEVELS

CROSS-REFERENCE TO RELATED APPLICATION

This application claims priority under 35 U.S.C. §119 to Korean Patent Application No. 10-2014-0136844 filed on Oct. 10, 2014, the disclosure of which is hereby incorporated by reference in its entirety.

BACKGROUND

Embodiments of the inventive concepts relate to semiconductor devices having active regions of different conductivity types.

Various methods of forming upper ends of gate electrodes at certain levels while simplifying a process in a semiconductor device having an NMOS region and a PMOS region have been studied. A P-type channel region formed in the NMOS region and an N-type channel region formed in the PMOS region may have different heights. The P-type channel region and the N-type channel region having the different heights may be an obstacle to formation of gate electrodes.

For example, an N-type fin may be formed on an N-well, and a P-type fin may be formed on a P-well. A channel SiGe layer may be formed on the N-type fin using a Selective Epitaxial Growth (SEG) technique. A first preliminary gate may be formed on the channel SiGe layer, and a second preliminary gate may be formed on the P-type fin. A first source/drain may be formed on both sides of the first preliminary gate. A second source/drain may be formed on both sides of the second preliminary gate. An interlayer insulating layer may be formed on the first source/drain and the second source/drain. A first trench and a second trench may be formed by removing the first preliminary gate and the second preliminary gate. A first gate and a second gate may be formed in the first trench and the second trench. The first gate and the second gate may be referred to as a replacement gate.

A process of forming the first gate and the second gate may include a Chemical Mechanical Polishing (CMP) process. The channel SiGe layer may protrude at a level higher than the P-type fin. Various problems may arise from a height difference between the first gate and the second gate in the CMP process.

SUMMARY

Various embodiments of the inventive concepts are not limited to the presently-mentioned embodiments; other embodiments which are not mentioned may be clearly understood by those of ordinary skill in the art based on the following descriptions.

In accordance with an aspect of the inventive concepts, a semiconductor device includes a substrate having a PMOS region and an NMOS region. A first active region is in the PMOS region. A second active region is in the NMOS region. A semiconductor layer is on the first active region. A first gate electrode is configured to cross the first active region and extend on the semiconductor layer. A second gate electrode is on the second active region. An upper end of the first active region extends to a level lower than an upper end of the second active region. A lower end of the first active region extends to a level lower than a lower end of the second active region.

In an embodiment, an upper end of the semiconductor layer may extend to a same horizontal level as the upper end of the second active region.

In another embodiment, upper ends of the first gate electrode and the second gate electrode may extend to the same horizontal level.

In still another embodiment, an upper end of the first active region may have a shape different from an upper end of the second active region.

In yet another embodiment, an upper end of the first active region may have a first radius of curvature. An upper end of the second active region may have a second radius of curvature. The first radius of curvature may be smaller than the second radius of curvature.

In yet another embodiment, the semiconductor layer may include a crystal growth material.

In yet another embodiment, the semiconductor layer may include SiGe formed by a Selective Epitaxial Growth (SEG) method.

In yet another embodiment, the semiconductor layer may be on side surfaces and an upper surface of the first fin active region.

In yet another embodiment, the first active region may have a height greater than a width thereof, and a lower end of the first gate electrode may extend to a level lower than an upper end of the first active region. The second active region may have a height greater than a width thereof, and a lower end of the second gate electrode may extend to a level lower than an upper end of the second active region.

In yet another embodiment, a gate dielectric layer is on, and in some embodiments surrounds, a bottom and a side surface of the first gate electrode. An upper end of the gate dielectric layer may extend to a level higher than a center of the first gate electrode.

In yet another embodiment, a first device isolation layer is on a side surface of the first active region. A second device isolation layer is on a side surface of the second active region. A lower end of the first device isolation layer extends to a level lower than a lower end of the second device isolation layer.

In yet another embodiment, an upper end of the first device isolation layer may extend to a level lower than an upper end of the second device isolation layer.

In yet another embodiment, a lower end of the semiconductor layer may extend to a level higher than the first device isolation layer.

In accordance with another aspect of the inventive concepts, another semiconductor device includes a substrate having a first region and a second region which has a conductivity type different from the first region. A first active region is in the first region. A second active region is in the second region. A semiconductor layer is on the first active region and has impurities of the same conductivity type as the first active region. An upper end of the first active region extends to a level lower than an upper end of the second active region. A lower end of the first active region extends to a level lower than a lower end of the second active region. An upper end of the semiconductor layer extends to the same horizontal level as the upper end of the second active region.

In an embodiment, the semiconductor layer may extend on a surface of the first active region.

In another embodiment, the semiconductor layer may include a crystal growth material.

In accordance with still another aspect of the inventive concepts, another semiconductor device includes a substrate having a first region and a second region which has a conductivity type different from the first region. A plurality of first active regions are in the first region and configured to be parallel to one another. A plurality of second active regions are in the second region and configured to be parallel to one another. A semiconductor layer is on the first active regions. A first gate electrode crosses the first active regions and is on the semiconductor layer. A second gate electrode is on the second active regions. Upper ends of the first active regions extend to levels lower than upper ends of the second active regions. Lower ends of the first active regions extend to levels lower than lower ends of the second active regions.

In an embodiment, the semiconductor layer may include impurities having a conductivity type the same as the first active regions. An upper end of the semiconductor layer may extend to the same horizontal level as the upper ends of the second active regions.

In another embodiment, a first device isolation layer is between the first active regions. A second device isolation layer is between the second active regions. An upper end of the first device isolation layer may extend to a level lower than an upper end of the second device isolation layer.

In still another embodiment, a source/drain is adjacent to an outer surface of the first gate electrode and is in contact with the semiconductor layer. The source/drain may include impurities having a conductivity type different from the semiconductor layer.

In accordance with yet another aspect of the inventive concepts, another semiconductor device includes a substrate having a face; a first fin on the face that protrudes away from the face, the first fin having a first fin bottom adjacent the face; a first fin top remote from the face and a first fin sidewall that extends between the first fin top and the first fin bottom; and a second fin on the face that protrudes away from the face, the second fin having a second fin bottom adjacent the face, a second fin top remote from the face and a second fin sidewall that extends between the second fin top and the second fin bottom. The first fin top and the second fin top are different distances away from the face. Also, the first fin bottom and the second fin bottom are different distances away from the face.

In an embodiment, the device further comprises a first well layer between the face and the first fin bottom; and a second well layer between the face and the second fin bottom. The first and second well layers have different thicknesses. In some embodiments, a first height of the first fin, from the first fin bottom to the first fin top, is same as a second height of the second fin, from the second fin bottom to the second fin top. Moreover, in some embodiments, the first and second fin tops have different radii of curvature.

In another embodiment, the semiconductor device further comprises a first device isolation layer on the first sidewall, the first device isolation layer having a first device isolation layer bottom adjacent the face and a first device isolation layer top remote from the face; and a second device isolation layer on the second sidewall, the second device isolation layer having a second device isolation layer bottom adjacent the face and a second device isolation layer top remote from the face. The first device isolation layer top and the second device isolation layer top are different distances away from the face. Also, the first device isolation layer bottom and the second device isolation layer bottom are different distances away from the face.

In still another embodiment, the semiconductor device further comprises a first well layer between the face and the first fin bottom and between the face and the first device isolation layer bottom; and a second well layer between the face and the second fin bottom and between the face and the second device isolation layer bottom. The first and second well layers have different thicknesses.

In yet another embodiment, the first fin and the first well layer comprise a conductivity type that is different from that of the second fin and second well layer.

Finally, in still other embodiments, the semiconductor device further comprises a semiconductor layer on the first fin top and the first fin sidewall and having a thickness such that a top of the semiconductor layer that is remote from the first fin top is same distance away from the face as the second fin top.

Detailed items of the other embodiments of the inventive concepts are included in the detailed descriptions and the accompanying drawings.

BRIEF DESCRIPTION OF THE DRAWINGS

The foregoing and other features and advantages of the inventive concepts will be apparent from the more particular description of various embodiments of the inventive concepts, as illustrated in the accompanying drawings in which like reference characters refer to the same parts throughout the different views. The drawings are not to scale except when indicated to the contrary herein, emphasis instead being placed upon illustrating the principles of the inventive concepts. In the drawings.

DETAILED DESCRIPTION OF THE EMBODIMENTS

Figure 1A:
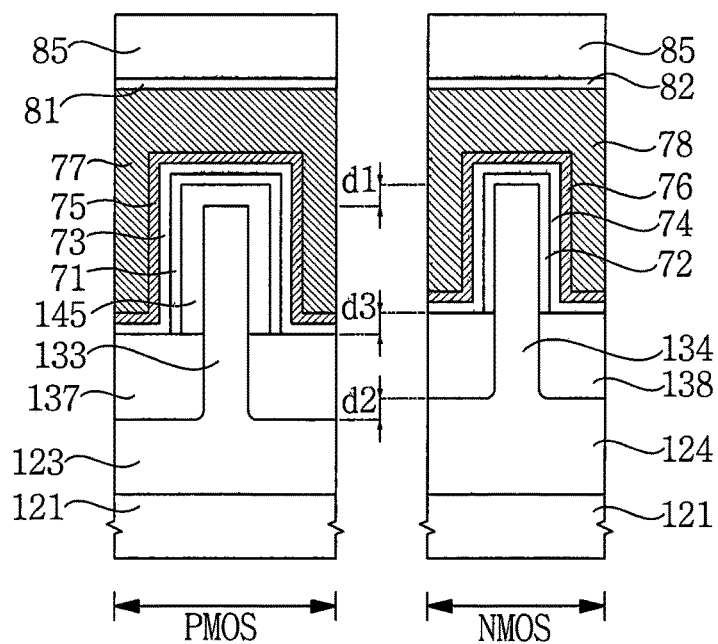
FIGS. 1A and 1B, which may be referred to herein collectively as FIG. 1, and FIGS. 2 to 4, are cross-sectional views for describing a semiconductor device in accordance with embodiments of the inventive concepts.

Advantages and features of the inventive concepts and methods of achieving them will be made apparent with reference to the accompanying figures and the embodiments to be described below in detail. However, the inventive concepts should not be limited to the embodiments set forth herein and may be construed as various embodiments in different forms. Rather, these embodiments are provided so that disclosure of the inventive concepts is thorough and complete, and fully conveys the inventive concepts to those of ordinary skill in the art. The inventive concepts are defined by the appended claims.

The terminology used herein is only intended to describe embodiments of the inventive concepts and not intended to limit the scope of the inventive concepts. As used herein, the singular forms "a," "an," and "the" are intended to include the plural forms as well, unless specifically indicated otherwise. The terms "comprises", "comprising", "has", "having", "includes" and/or "including", and variants thereof, that are used herein specify the presence of mentioned elements, steps, operations, and/or devices, but do not preclude the presence or addition of one or more of Other elements, steps, operations, and/or devices.

When one element (elements) is (are) "connected" or "coupled" to other element(s), this may indicate that the one element (elements) is directly connected or coupled to the other elements(s), or intervening elements may be present. On the other hand, when one element referred to as "directly connected (directly connected to)" or "directly coupled (directly coupled to)" other element(s), there are no intervening element(s). Throughout the entire specification, the same reference numerals refer to the same components. The phrase "and/or" includes each and all combinations of one or more of the items mentioned.

Spatially relative terms, such as "below," "beneath," "lower," "above," "upper," and the like, may be used herein to easily describe the correlation between one device or elements and another device or other elements as illustrated in the figures. The spatially relative terms should be understood as terms that include different orientations of the device in additional usage or operation of the orientations illustrated in figures. For example, when the device illustrated in the figures is turned over, the device described as disposed "below" or "beneath" another device may be disposed "above" the other device. Accordingly, the exemplary term "below" or "beneath" may include both orientations of below and above. The device may be oriented at other orientations, and the spatially relative terms used herein may be interpreted accordingly.

Further, embodiments are described herein with reference to cross-sectional views and/or plan views that are idealized schematic views of the inventive concepts. The thicknesses of layers and parts in the figures may be overstated for the effective description of technical content, except when indicated to the contrary therein. Thus, shapes of the schematic views may vary according to manufacturing techniques and/or tolerances. Therefore, the embodiments of the inventive concepts are not limited to the particular shapes illustrated herein but are to include deviations in shapes formed in accordance with the manufacturing process. For example, an etched region illustrated as a rectangular shape may be a rounded shape or a shape of a certain curvature. Thus, the regions illustrated in the figures are schematic in nature, and the shapes of the regions illustrated in the figures are intended to illustrate particular shapes of regions of devices and not intended to limit the scope of the inventive concepts, unless indicated to the contrary herein.

Further, like numbers refer to like elements throughout the entire text herein. Thus, the same or similar numbers may be described with reference to other figures even if those numbers are neither mentioned nor described in the corresponding figures. Further, elements that are not denoted by reference numbers may be described with reference to other figures.

The terms such as "front side" and "back side" are used herein as relative concepts to describe the embodiments of the inventive concepts for easy understanding. Thus, the terms "front side" and "back side" do not necessarily indicate specific directions, locations, or elements but can be used interchangeably. For example, a term "front side" may be interpreted as a term "back side," and a term "back side" may be interpreted as a term "front side." Accordingly, the term "front side" may be expressed as a term "first side," and a term "back side" may be expressed as a term "second side." Conversely, a term "back side" may be expressed as a term "first side," and a term "front side" may be expressed as a term "second side." However, the terms "front side" and "back side" are not used in the same sense in one embodiment.

A term such as "near" used herein indicates that any one of at least two elements having symmetrical concepts is disposed nearer to another specific element than the others thereof. For example, the expression such as a first end is close to a first side may be inferred as the first end is closer to the first side than a second end, or the first end is closer to the first side than a second side.

Figure 1B:
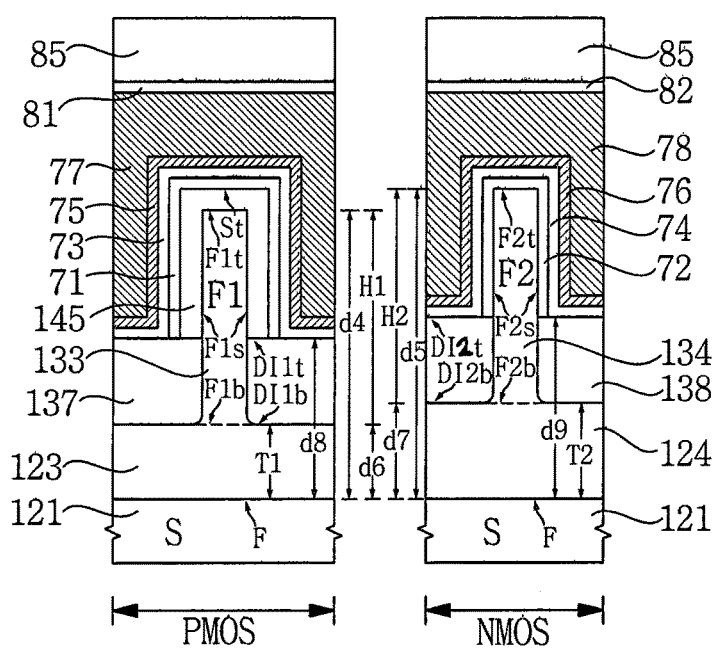

FIGS. 1A and 1B, which may be referred to herein collectively as FIG. 1, and FIGS. 2 to 4, are cross-sectional views for describing a semiconductor device in accordance with embodiments of the inventive concepts.

Referring to FIG. 1A, an N-well 123, a P-well 124, a first fin active region 133, a second fin active region 134, a first device isolation layer 137, a second device isolation layer 138, a semiconductor layer 145, a first lower gate dielectric layer 71, a second lower gate dielectric layer 72, a first upper gate dielectric layer 73, a second upper gate dielectric layer 74, a first lower gate electrode 75, a second lower gate electrode 76, a first upper gate electrode 77, a second upper gate electrode 78, a first gate capping layer 81, a second gate capping layer 82, and an upper insulating layer 85 may be formed on a semiconductor substrate 121 having an NMOS region and a PMOS region. Although the PMOS and NMOS regions are illustrated as being spaced apart for convenience, it will be understood that a single, unitary semiconductor device, such as a single integrated circuit chip, is present in all embodiments illustrated herein.

An upper end of the first fin active region 133 may extend to a level lower than an upper end of the second fin active region 134. The upper end of the first fin active region 133 and the upper end of the second fin active region 134 may extend to have a difference of a first thickness d1. A lower end of the first fin active region 133 may extend to a level lower than a lower end of the second fin active region 134. The lower end of the first fin active region 133 and the lower end of the second fin active region 134 may extend to have a difference of a second thickness d2.

An upper end of the first device isolation layer 137 may extend to a level lower than the upper end of the first fin active region 133. A side surface and the upper end of the first fin active region 133 may protrude from the upper end of the first device isolation layer 137. An upper end of the second device isolation layer 138 may extend to a level lower than the upper end of the second fin active region 134. A side surface and the upper end of the second fin active region 134 may protrude from the upper end of the second device isolation layer 138. The upper end of the first device isolation layer 137 may extend to a level lower than the upper end of the second device isolation layer 138. The upper end of the first device isolation layer 137 and the upper end of the second device isolation layer 138 may have a difference of a third thickness d3. A lower end of the first device isolation layer 137 may directly contact the N-well 123. A lower end of the second device isolation layer 138 may directly contact the P-well 124. The lower end of the first device isolation layer 137 may extend to a level lower than the lower end of the second device isolation layer 138.

The semiconductor layer 145 may extend on the first fin active region 133. The semiconductor layer 145 may directly contact the side surfaces and an upper surface of the first fin active region 133. An upper end of the semiconductor layer 145 may extend to the same level as the upper end of the second fin active region 134. A lower end of the semiconductor layer 145 may extend directly on the first device isolation layer 137. The semiconductor layer 145 may include a crystal growth material. The semiconductor layer 145 may be defined on side surfaces and the upper surface of the first fin active region 133. The semiconductor layer 145 may extend partially on an upper level of the first device isolation layer 137. The semiconductor layer 145 may include N-type impurities. The semiconductor layer 145 may include SiGe, Si, P and/or As. For example, the semiconductor layer 145 may include SiGe formed by a selective epitaxial growth (SEG) method. An amount of Ge contained in the semiconductor layer 145 may be in a range of approximately 25 to approximately 50%. An amount of Ge contained in the semiconductor layer 145 may be approximately 30%.

Upper surfaces of the first upper gate electrode 77 and the second upper gate electrode 78 may extend to the same plane.

In another embodiment, the first fin active region 133 may be in the NMOS region, and the second fin active region 134 may be in the PMOS region. The first fin active region 133 may include P-type impurities. The semiconductor layer 145 may include P-type impurities. The semiconductor layer 145 may include SiC, Si, B and/or BF.

Referring to FIG. 1B, a semiconductor device according to various other embodiments of the inventive concepts include a substrate S having a face F. In some embodiments, either one of the opposing faces of the semiconductor substrate S may be regarded as the face F. A first fin F1 is on the face F and protrudes away from the face F. The first fin F1 has a first fin bottom F1$b$ adjacent the face F, a first fin top F1$t$ remote from the face F and the first fin sidewall F1$s$ that extends between the first fin top F1$t$ and the first fin bottom F1$b$. A second fin F2 is also provided on the face F and protrudes away from the face F. The second fin F2 has a second fin bottom F2$b$ adjacent the face F, a second fin top F2$t$ remote from the face F and a second fin sidewall F2$s$ that extends between the second fin top F2$t$ and the second fin bottom F2$b$. The first fin top F1$t$ and the second fin top F2$t$ are different distances away from the face F, as denoted by distances D4 and D5, respectively. Moreover, the first fin bottom F1$b$ and the second fin bottom F2$b$ are different distances away from the face F, as denoted by distances D6 and D7, respectively.

Other embodiments may also include a first well layer 123 between the face F and the first fin bottom F1$b$, and a second well layer 124 between the face F and the second fin bottom F2$b$. As illustrated in FIG. 1B, the first and second well layers 123 and 124, respectively, have different thicknesses T1 and T2, respectively.

As also illustrated in FIG. 1B, a first height H1 of the first fin F1, from the first fin bottom F1$b$ to the first fin top F1$t$, is the same as a second height H2 of the second fin F2, from the second fin bottom F2$b$ to the second fin top F2$t$.

As also illustrated in FIG. 1B, the semiconductor device further comprises a first device isolation layer 137 on the first sidewall F1$s$. The first device isolation layer 137 has a first device isolation layer bottom DI1$b$ adjacent the face F and a first device isolation layer top DI1$t$ remote from the face F. A second device isolation layer 138 is also provided on the second sidewall F2$s$. The second device isolation layer 138 has a second device isolation layer bottom DI2$b$ adjacent the face F and a second device isolation layer top DI2$t$ remote from the face F. The first device isolation layer top DI1$t$ and the second device isolation layer top DI2$t$ are different distances D8, D9, respectively, away from the face F. Moreover, the first device isolation layer bottom DI1$b$ and the second device isolation layer bottom DI2$b$ are different distances T1, T2, respectively, away from the face F. In any of the embodiments described in FIG. 1I1, the first fin F1 and the first well layer 123 may comprise a conductivity type that is different from that of the second fin F2 and the second well layer 124.

In some embodiments, a semiconductor layer 145 also may be provided on the first fin top F1$t$ and the first fin sidewall F1$s$. The semiconductor layer 145 has a thickness such that a top St of the semiconductor layer 145 that is remote from the first fin top F1$t$ is the same distance D5 away from the face F as the second fin top F2$t$.

Figure 2:
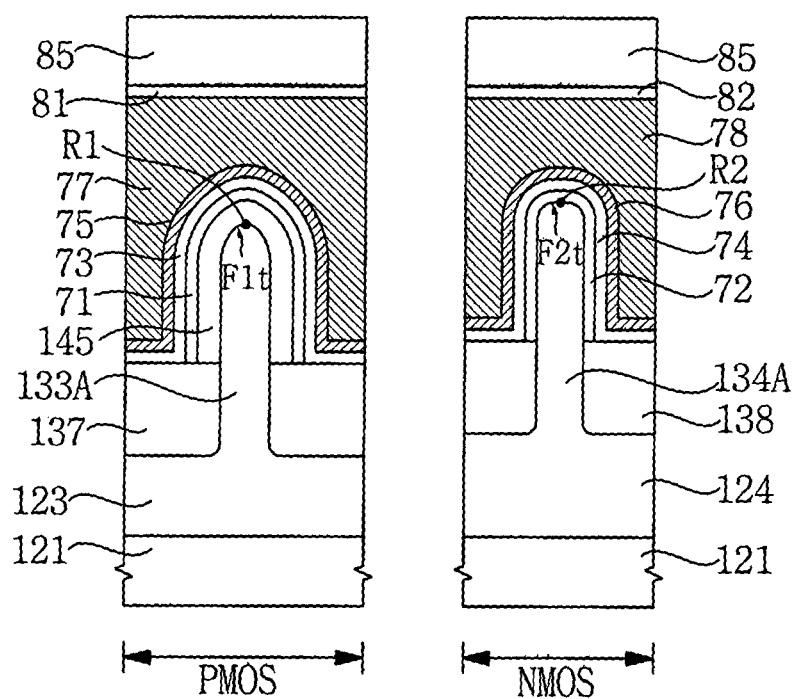

Referring to FIG. 2, an upper end of a first fin active region 133A may have a shape different from an upper end of a second fin active region 134A. The upper end of the first fin active region 133A may be roundly formed. The upper end of the first fin active region 133A may have a first radius of curvature R1. The upper end of the second fin active region 134A may be roundly formed. The upper end of the second fin active region 134A may have a second radius of curvature R2. The first radius of curvature R1 may be smaller than the second radius of curvature R2. Stated differently, the first and second fin tops F1$t$, F2$t$, respectively, have different radii of curvature R1, R2, respectively.

Figure 3:
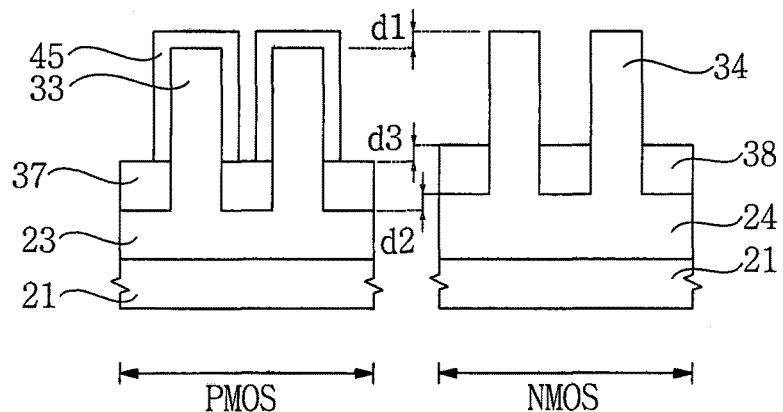

Referring to FIG. 3, an N-well 23, a P-well 24, first fin active regions 33, second fin active regions 34, a first device isolation layer 37, a second device isolation layer 38, and a semiconductor layer 45 may be on a semiconductor substrate 21 having an NMOS region and a PMOS region.

The first fin active regions 33 may extend to a level lower than the second fin active regions 34. Upper ends of the first fin active regions 33 may extend to a level lower than upper ends of the second fin active regions 34. The upper ends of the first fin active regions 33 and the upper ends of the second fin active regions 34 may have a difference of a first thickness d1. Lower ends of the first fin active regions 33 may extend to a level lower than lower ends of the second fin active regions 34. The lower ends of the first fin active regions 33 and the lower ends of the second fin active regions 34 may have a difference of a second thickness d2.

Side surfaces and the upper ends of the first fin active regions 33 may protrude from an upper end of the first device isolation layer 37. Side surfaces and the upper ends of the second fin active regions 34 may protrude from an upper end of the second device isolation layer 38. The upper end of the first device isolation layer 37 may extend to a level lower than the upper end of the second device isolation layer 38. The upper ends of the first device isolation layer 37 and the upper ends of the second device isolation layer 38 may have a difference of a third thickness d3. Lower ends of the first device isolation layer 37 may extend to a level lower than lower ends of the second device isolation layer 38.

A semiconductor layer 45 may be on the first fin active regions 33. An upper end of the semiconductor layer 45 may extend to the same level as the upper ends of the second fin active regions 34. The semiconductor layer 45 may include a crystal growth material. The semiconductor layer 45 may extend on the side surfaces and upper surfaces of the first fin active regions 33. The semiconductor layer 45 may include N-type impurities. The semiconductor layer 45 may include SiGe, Si, P and/or As. For example, the semiconductor layer 45 may include SiGe formed by a SEG method.

Figure 4:
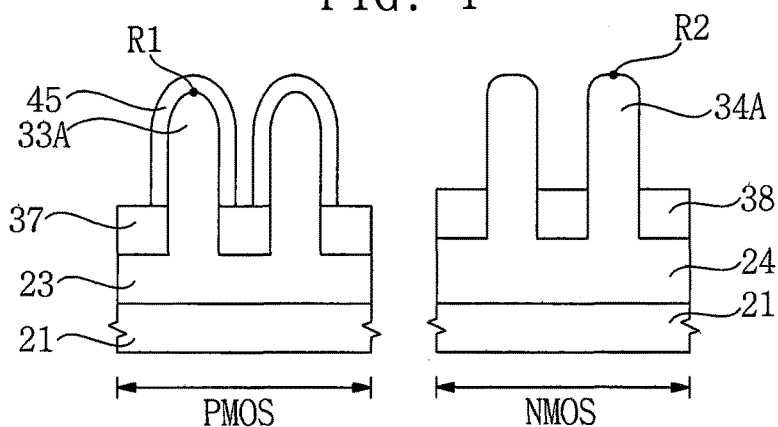

Referring to FIG. 4, upper ends of first fin active regions 33A may have shapes different from upper ends of second fin active regions 34A. Each of the upper ends of the first fin active regions 33A may have a first radius of curvature R1. Each of the upper ends of the second fin active regions 34A may have a second radius of curvature R2. The first radius of curvature R1 may be smaller than the second radius of curvature R2.

Figure 5:
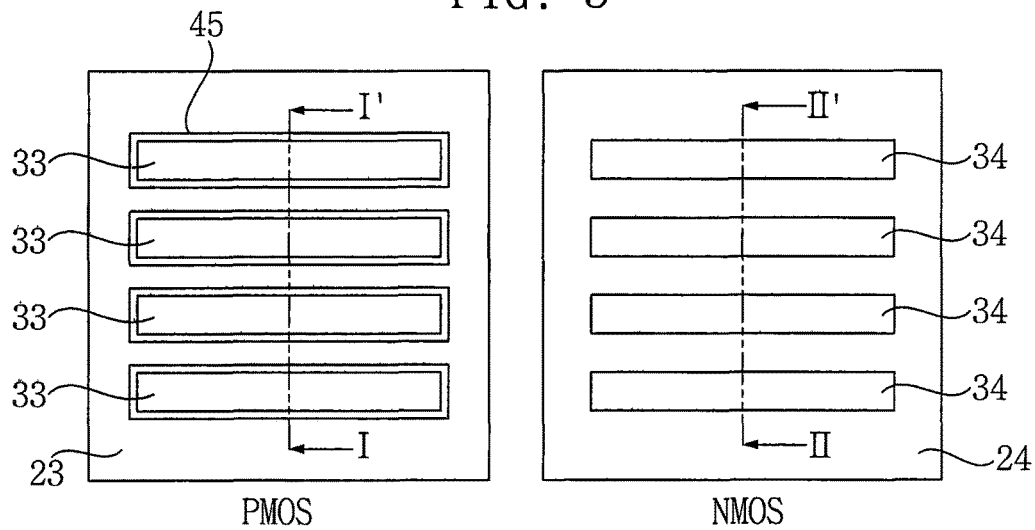
FIG. 5 is a layout for describing a method of forming a semiconductor device in accordance with an embodiment of the inventive concepts.

FIG. 5 is a layout for describing a method of forming a semiconductor device in accordance with an embodiment of the inventive concepts, and FIGS. 6 to 24 are cross-sectional views taken along lines I-I' and II-II' of FIG. 5 for describing the method of forming the semiconductor device in accordance with the embodiment of the inventive concepts.

Figure 6:
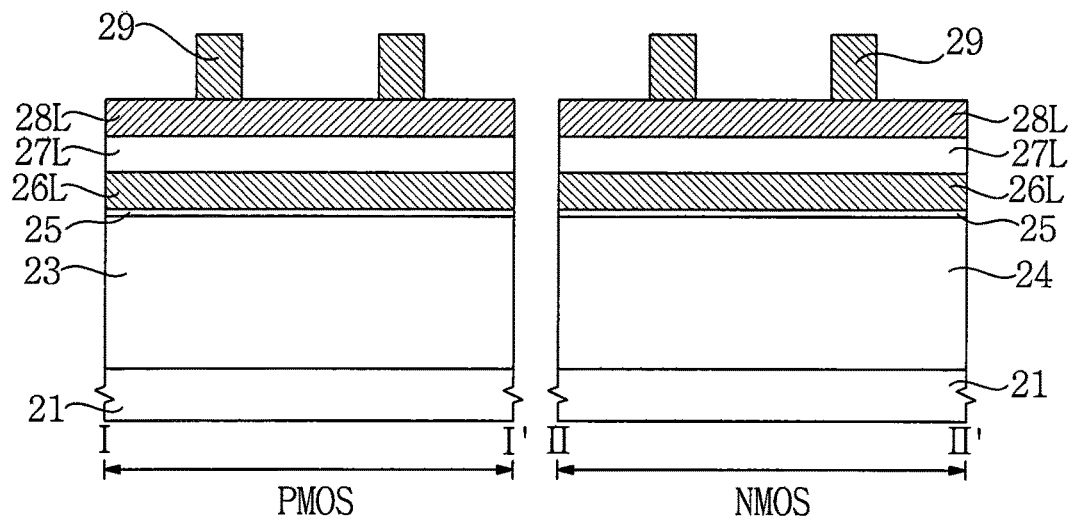
FIGS. 6 to 24 are cross-sectional views for describing the method of forming a semiconductor device in accordance with the embodiment of the inventive concepts.

Referring to FIGS. 5 and 6, an N-well 23, a P-well 24, a pad layer 25, a first mask layer 26L, a second mask layer 27L, a third mask layer 28L, and a fourth mask pattern 29 may be formed on a semiconductor substrate 21 having an NMOS region and a PMOS region.

The semiconductor substrate 21 may be a bulk wafer or a silicon on insulator (SOI) wafer. For example, the semiconductor substrate 21 may be a single-crystalline silicon wafer having P-type impurities. The N-well 23 may be formed in the PMOS region. The N-well 23 may include N-type impurities. For example, the N-type impurities may include P and/or As. The P-well 24 may be formed in the NMOS region. The P-well 24 may include P-type impurities. For example, the P-type impurities may include B, BF and/or 8F2.

The pad layer 25 may be on, and in some embodiments cover, the N-well 23 and the P-well 24. For example, the pad layer 25 may include silicon oxide. The first mask layer 26L may be on, and in some embodiments cover, the N-well 23 and the P-well 24. The pad layer 25 may be interposed between the first mask layer 26L and the N-well 23 and between the first mask layer 26L and the P-well 24. The second mask layer 27L may be on, and in some embodiments cover, the first mask layer 26L. The first mask layer 26L and the second mask layer 27L may include a material having an etch selectivity with respect to the N-well 23 and the P-well 24. The second mask layer 27L may include a material different from the first mask layer 26L. For example, the first mask layer 26L may include silicon nitride, and the second mask layer 27L may include a Middle Temperature Oxide (MTO).

The third mask layer 28L may include a material having an etch selectivity with respect to the first mask layer 26L and the second mask layer 27L. The third mask layer 28L may include a material different from the first mask layer 26L and the second mask layer 27L. For example, the third mask layer 28L may include polysilicon. The fourth mask pattern 29 may include a material having an etch selectivity with respect to the third mask layer 28L. The fourth mask pattern 29 may include a material different from the third mask layer 28L. For example, the fourth mask pattern 29 may include a Spin On Hardmask (SOH) material. The fourth mask pattern 29 may be formed by performing a thin layer forming process and a photo process.

Figure 7:
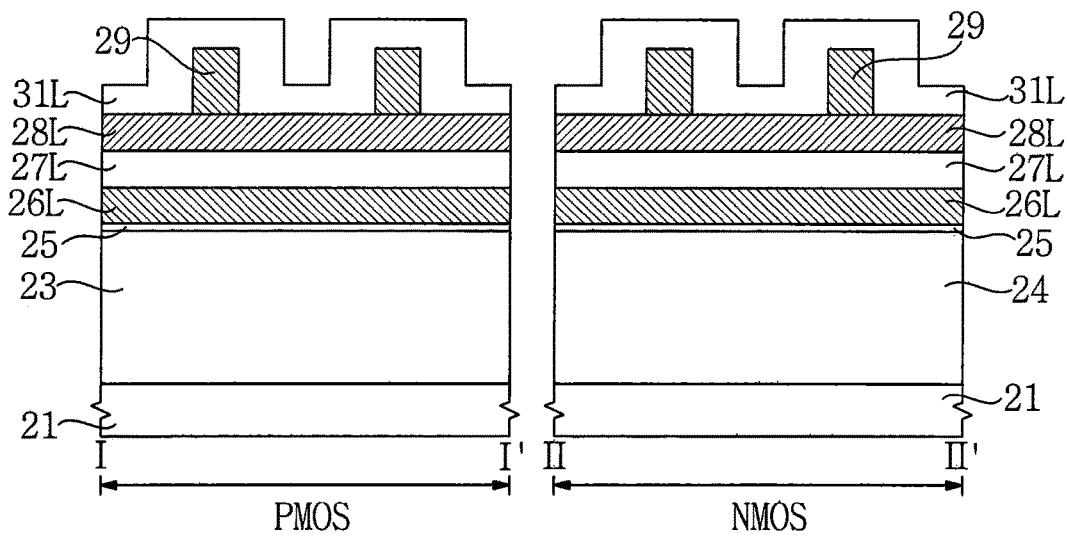

Referring to FIGS. 5 and 7, a fifth mask layer 31L may be formed on the third mask layer 28L and the fourth mask pattern 29. The fifth mask layer 31L may be on, and in some embodiments cover, the third mask layer 28L and side surfaces and an upper surface of the fourth mask pattern 29. The fifth mask layer 31L may include a material having an etch selectivity with respect to the third mask layer 28L and the fourth mask pattern 29. The fifth mask layer 31L may include a material different from the third mask layer 28L and the fourth mask pattern 29. For example, the fifth mask layer 31L may include an Atomic Layer Deposition (ALD) oxide.

Figure 8:
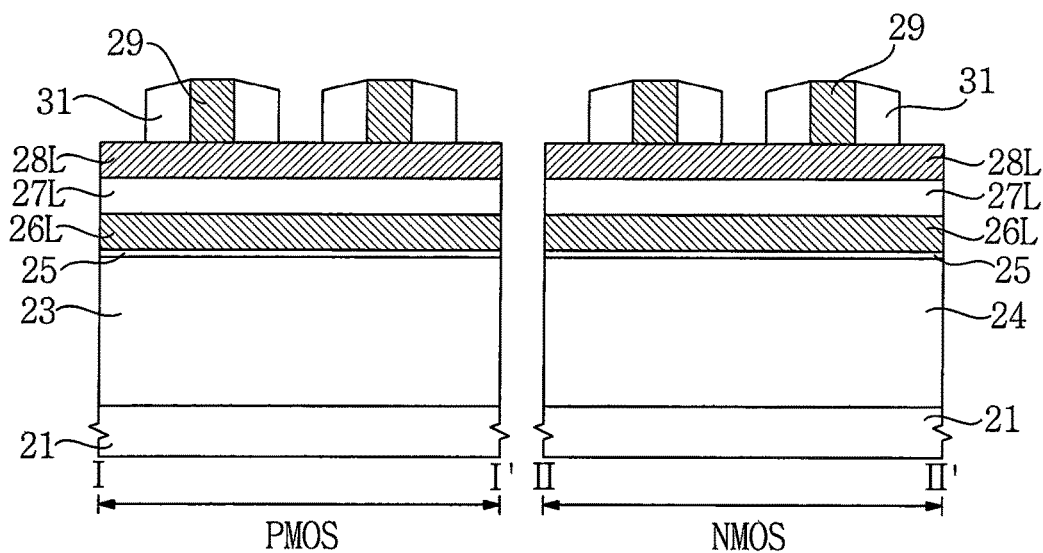

Referring to FIGS. 5 and 8, a fifth mask pattern 31 may be formed by anisotropically etching the fifth mask layer 31L. The fifth mask pattern 31 may be interpreted as a spacer. The fifth mask pattern 31 may remain on side surfaces of the fourth mask pattern 29. Upper ends of the fourth mask pattern 29 may be exposed.

Figure 9:
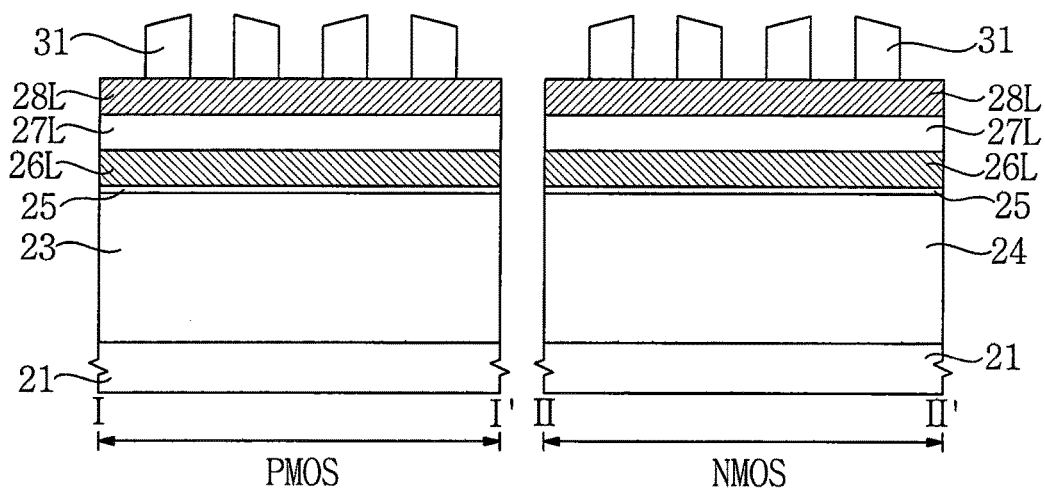

Referring to FIGS. 5 and 9, the third mask layer 28L may be exposed by removing the fourth mask pattern 29. The fifth mask pattern 31 may remain on the third mask layer 28L.

Figure 10:
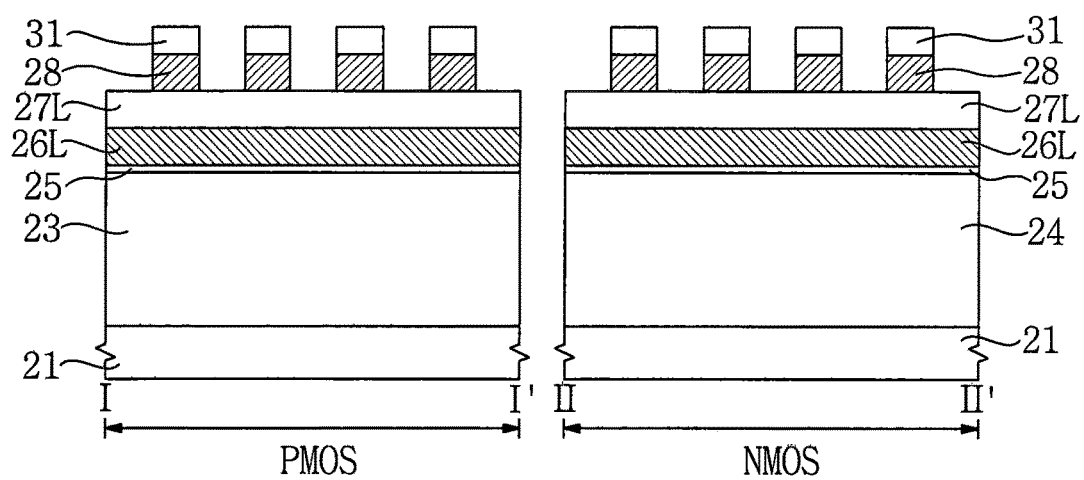

Referring to FIGS. 5 and 10, a third mask pattern 28 may be formed using the fifth mask pattern 31 as an etch mask and partially removing the third mask layer 28L. A thickness of the fifth mask pattern 31 may be decreased while forming the third mask pattern 28.

Figure 11:
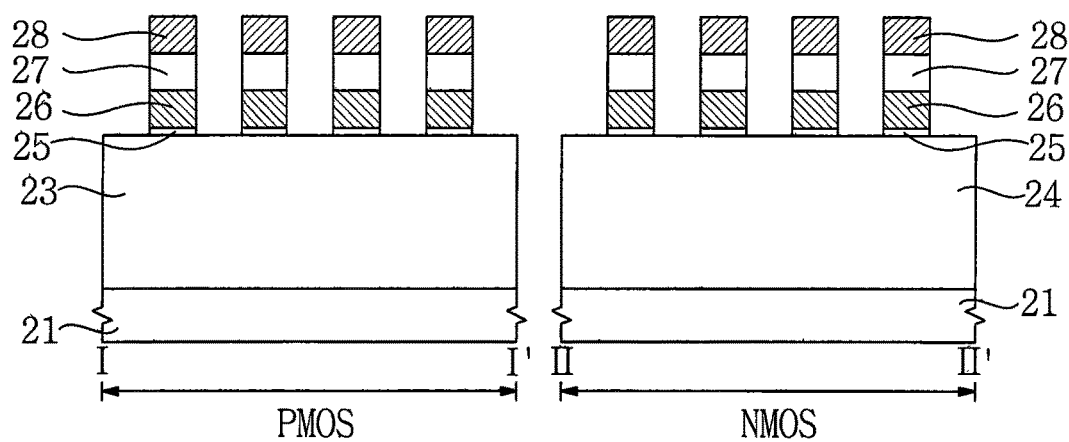

Referring to FIGS. 5 and 11, a second mask pattern 27 may be formed by partially removing the second mask layer 27L. A first mask pattern 26 may be formed by partially removing the first mask layer 26L. The pad layer 25 may remain between the first mask pattern 26 and the N-well 23 and between the first mask pattern 26 and the P-well 24. An anisotropic etching process, which uses the fifth mask pattern 31 and the third mask pattern 28 as etch masks, may be applied in the formation of the second mask pattern 27 and the first mask pattern 26. A thickness of the fifth mask pattern 31 may be decreased or completely removed while forming the second mask pattern 27 and the first mask pattern 26.

Figure 12:
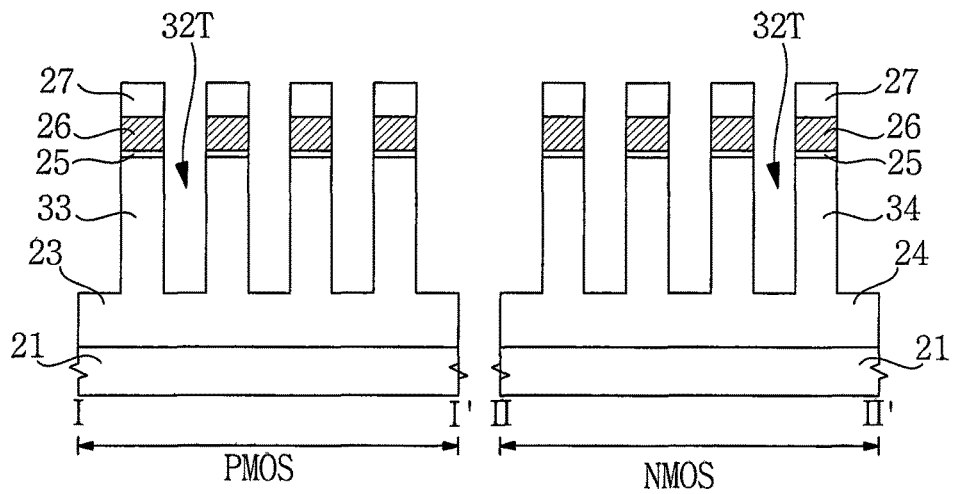

Referring to FIGS. 5 and 12, a plurality of trenches 32T may be formed using the second mask pattern 27 and the first mask pattern 26 as etch masks. First fin active regions 33 in the N-well 23 and second fin active regions 34 in the P-well 24 may be defined by the trenches 32T. An anisotropic etching process may be applied in the formation of the trenches 32T. The third mask pattern 28 may be completely removed while forming the trenches 32T.

The first fin active regions 33 may include N-type impurities. For example, the first fin active regions 33 may include single-crystalline silicon having N-type impurities. The first fin active regions 33 may extend in parallel. Each of the first fin active regions 33 may have a height greater than a width thereof. The second fin active regions 34 may include P-type impurities. For example, the second fin active regions 34 may include single-crystalline silicon having P-type impurities. The second fin active regions 34 may be in parallel. Each of the second fin active regions 34 may have a height greater than a width thereof.

Figure 13:
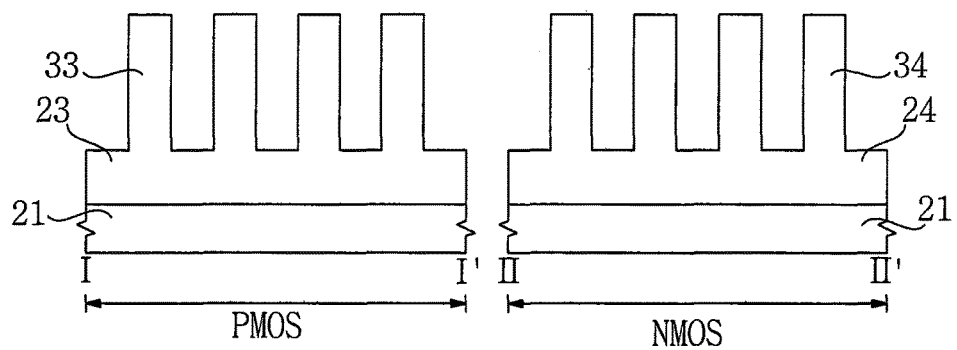

Referring to FIGS. 5 and 13, the first fin active regions 33 and the second fin active regions 34 may be exposed by removing the second mask pattern 27, the first mask pattern 26, and the pad layer 25.

Figure 14:
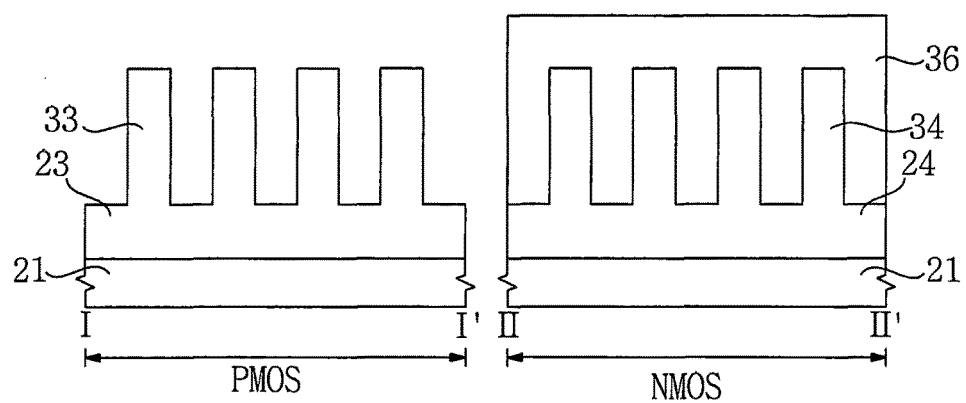

Referring to FIGS. 5 and 14, a sixth mask pattern 36 on, and in some embodiments covering, the NMOS region and exposing the PMOS region may be formed. The second fin active regions 34 may be at least partially covered by the sixth mask pattern 36, and the first fin active regions 33 may be exposed. The sixth mask pattern 36 may be formed using a photolithography process.

Figure 15:
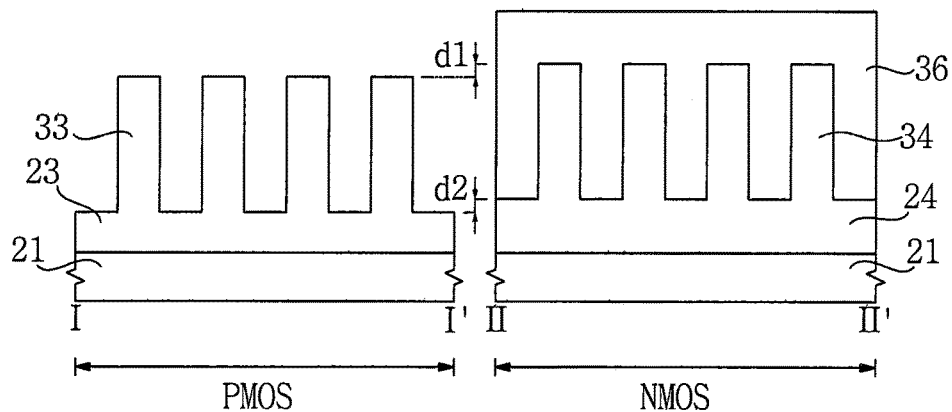

Referring to FIGS. 5 and 15, the first fin active regions 33 may be formed at a level lower than the second fin active regions 34 using an etch-back process. The etch-back process may include an anisotropic etching process.

Upper ends of the first fin active regions 33 may be recessed downward. The upper ends of the first fin active regions 33 may be formed at a level lower than upper ends of the second fin active regions 34. The upper ends of the first fin active regions 33 and the upper ends of the second fin active regions 34 may be formed to have a difference of a first thickness d1. When the upper ends of the first fin active regions 33 are recessed downward, the N-well 23 may also be partially recessed. Lower ends of the first fin active regions 33 may be formed at a level lower than lower ends of the second fin active regions 34. The lower ends of the first fin active regions 33 and the lower ends of the second fin active regions 34 may be formed to have a difference of a second thickness d2.

In another embodiment, upper ends of the first fin active regions 33 and upper ends of the second fin active regions 34 may be roundly formed. The upper ends of the first fin active regions 33 may have shapes different from the upper ends of the second fin active regions 34.

Figure 16:
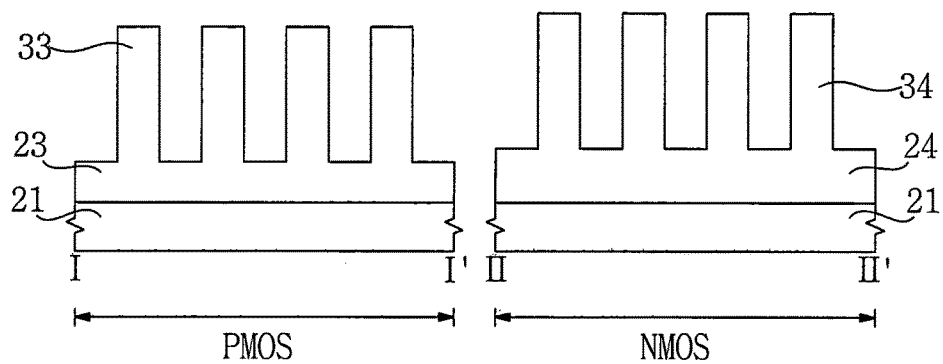

Referring to FIGS. 5 and 16, the first fin active regions 33 and the second fin active regions 34 may be exposed by removing the sixth mask pattern 36.

Figure 17:
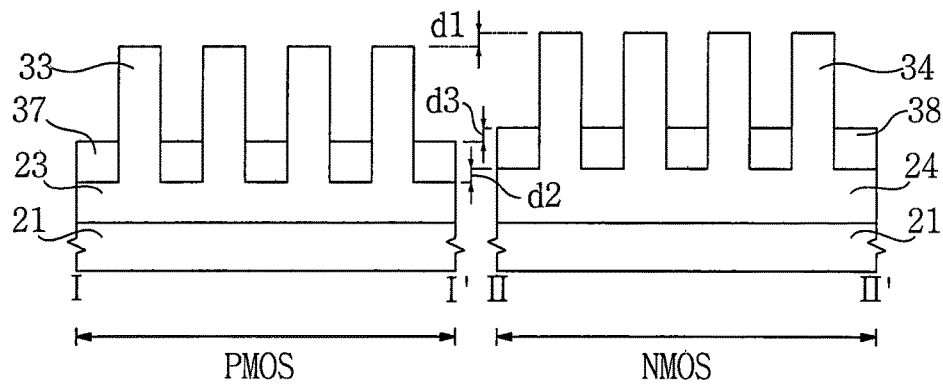

Referring to FIGS. 5 and 17, a first device isolation layer 37 and a second device isolation layer 38 may be formed between the first fin active regions 33 and between the second fin active regions 34, respectively. An upper end of the first device isolation layer 37 may be formed at a level lower than upper ends of the first fin active regions 33. Side surfaces and the upper ends of the first fin active regions 33 may protrude from the upper end of the first device isolation layer 37. An upper end of the second device isolation layer 38 may be formed at a level lower than upper ends of the second fin active regions 34. Side surfaces and the upper ends of the second fin active regions 34 may protrude from the upper end of the second device isolation layer 38.

The first device isolation layer 37 and the second device isolation layer 38 may include silicon oxide, silicon nitride and/or silicon oxy-nitride. For example, the first device isolation layer 37 and the second device isolation layer 38 may be formed using a Flowable Chemical Vapor Deposition (FCVD) technique, a TOnen SilaZene (TOSZ) technique, or a combination thereof. The upper end of the first device isolation layer 37 may be formed at a level lower than the upper end of the second device isolation layer 38. The upper end of the first device isolation layer 37 and the upper end of the second device isolation layer 38 may be formed to have a difference of a third thickness d3. A lower end of the first device isolation layer 37 may directly contact the N-well 23. A lower end of the second device isolation layer 38 may directly contact the P-well 24. The lower end of the first device isolation layer 37 may be formed at a level lower than the lower end of the second device isolation layer 38.

In another embodiment, the upper end of the first device isolation layer 37 and the upper end of the second device isolation layer 38 may be formed at the same level.

Figure 18:
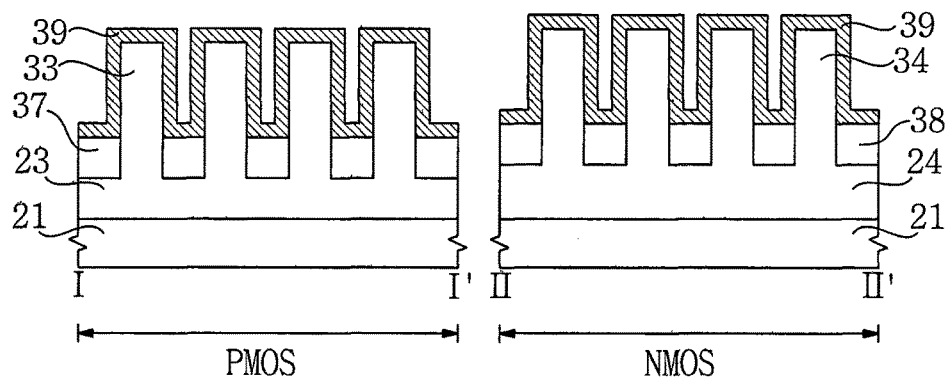

Referring to FIGS. 5 and 18, a seventh mask layer 39 may be formed. The seventh mask layer 39 may be on, and in some embodiments cover, the first device isolation layer 37, the second device isolation layer 38, the first fin active regions 33, and the second fin active regions 34. The seventh mask layer 39 may include a material having an etch selectivity with respect to the first device isolation layer 37 and the second device isolation layer 38. For example, the seventh mask layer 39 may include silicon nitride.

Figure 19:
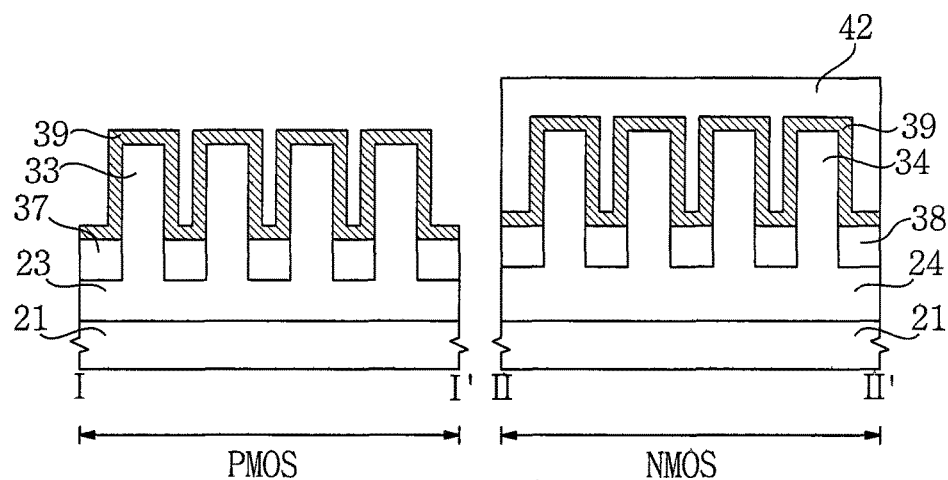

Referring to FIGS. 5 and 19, an eighth mask pattern 42 on, and in some embodiments covering, the NMOS region and exposing the PMOS region may be formed. The eighth mask pattern 42 may be formed using a photolithography process. The seventh mask layer 39 on the second fin active regions 34 may be at least partially covered by the eighth mask pattern 42. The seventh mask layer 39 on the first fin active regions 33 may be exposed.

Figure 20:
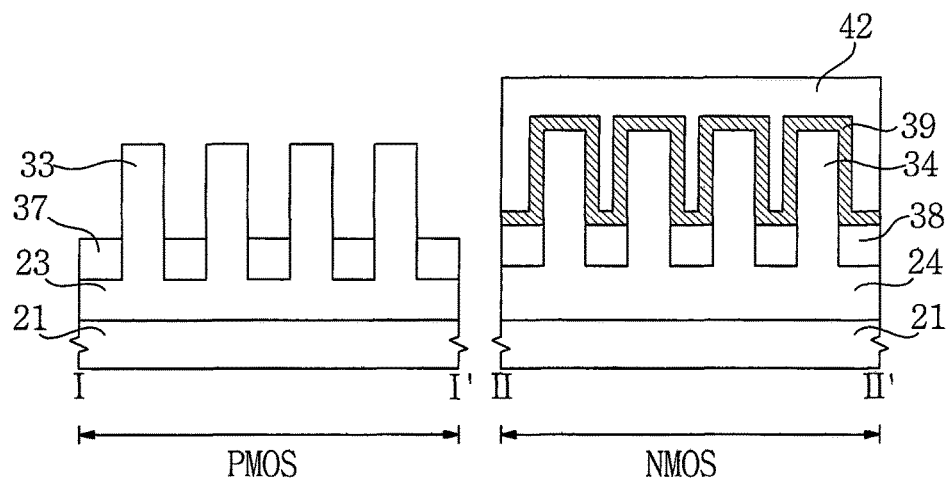

Referring to FIGS. 5 and 20, the first fin active regions 33 may be exposed by partially removing the seventh mask layer 39.

Figure 21:
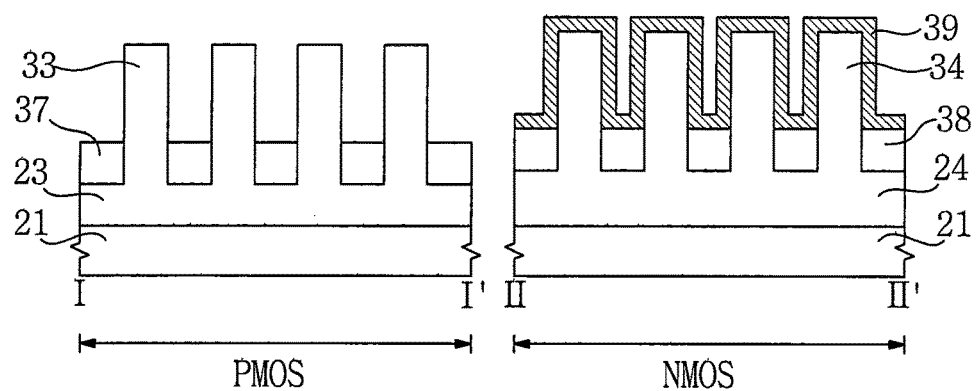

Referring to FIGS. 5 and 21, the eighth mask pattern 42 may be removed. The seventh mask layer 39 may remain in the NMOS region. The seventh mask layer 39 may at least partially cover the second fin active regions 34. The first fin active regions 33 may be exposed in the PMOS region.

Figure 22:
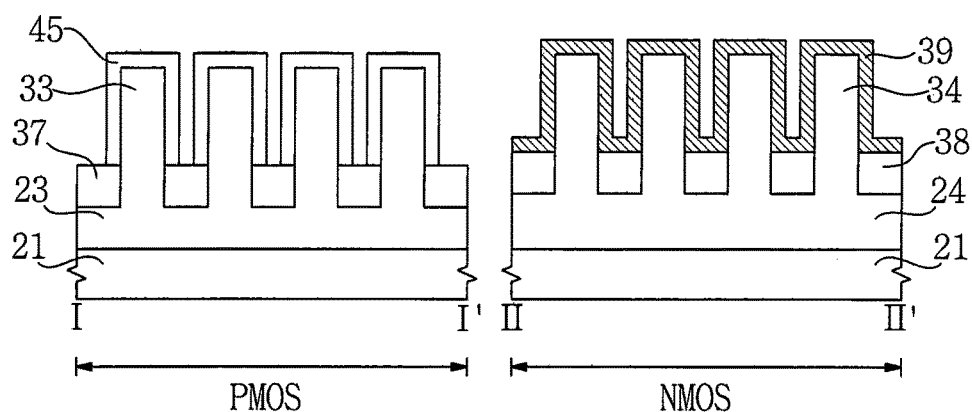

Referring to FIGS. 5 and 22, a semiconductor layer 45 may be formed on the first fin active regions 33. The semiconductor layer 45 may directly contact side surfaces and upper surfaces of the first fin active regions 33. An upper end of the semiconductor layer 45 may be formed at the same level as upper ends of the second fin active regions 34. A lower end of the semiconductor layer 45 may be directly formed on the first device isolation layer 37.

The semiconductor layer 45 may include a crystal growth material. The semiconductor layer 45 may be defined by side surfaces and upper surfaces of the first fin active regions 33. The semiconductor layer 45 may be restrictively formed on the upper end of the first device isolation layer 37. The semiconductor layer 45 may include N-type impurities. The semiconductor layer 45 may include SiGe, Si, P and/or As. For example, the semiconductor layer 45 may include SiGe formed by a SEG method. An amount of Ge contained in the semiconductor layer 45 may be in a range of approximately 25 to 50%. An amount of Ge contained in the semiconductor layer 45 may be approximately 30%.

In another embodiment, the first fin active regions 33 may be formed in the NMOS region, and the second fin active regions 34 may be formed in the PMOS region. The first fin active regions 33 may include P-type impurities. The semiconductor layer 45 may include P-type impurities. The semiconductor layer 45 may include SiC, Si, B and/or BF.

Figure 23:
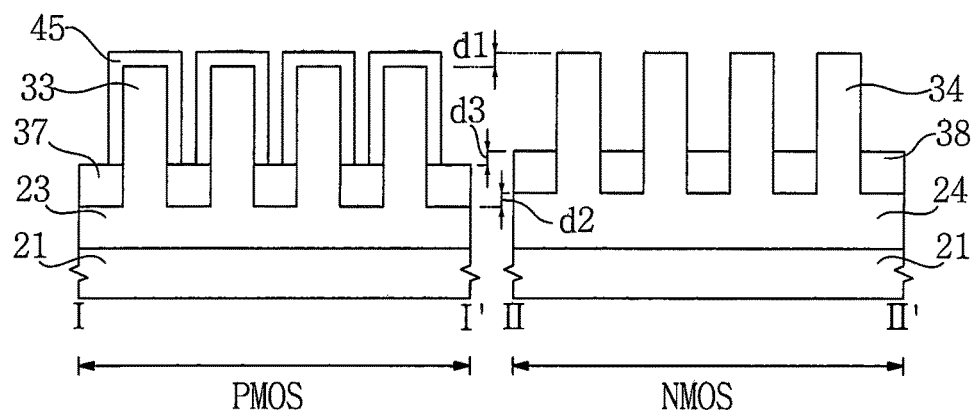

Referring to FIGS. 5 and 23, the second fin active regions 34 may be exposed by removing the seventh mask layer 39.

Figure 24:
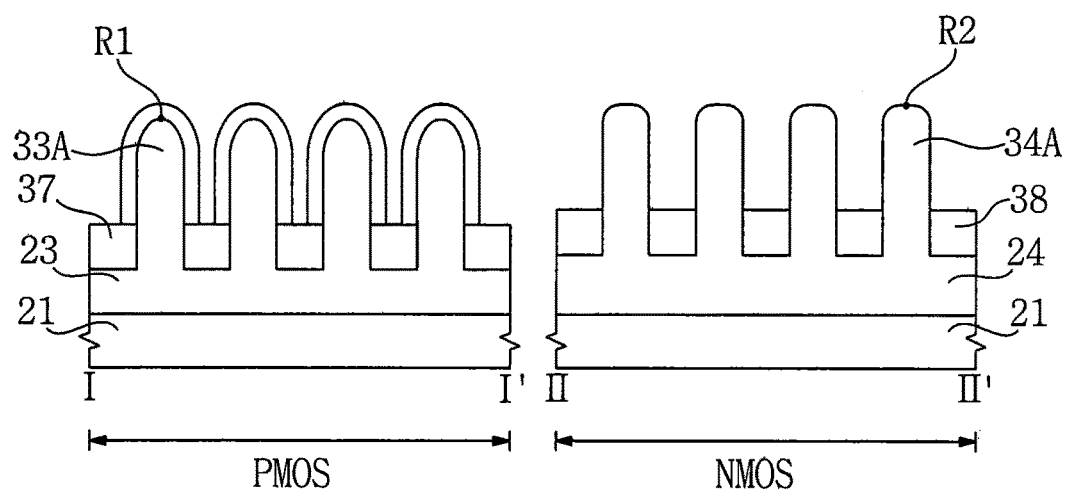

Referring to FIGS. 5 and 24, upper ends of first fin active regions 33A may have shapes different from upper ends of second fin active regions 34A. Each of the upper ends of the first fin active regions 33A may be roundly formed. Each of the upper ends of the first fin active regions 33A may have a first radius of curvature R1. Each of the upper ends of the second fin active regions 34A may be roundly formed. Each of the upper ends of the second fin active regions 34A may have a second radius of curvature R2. The first radius of curvature R1 may be smaller than the second radius of curvature R2.

Figure 25:
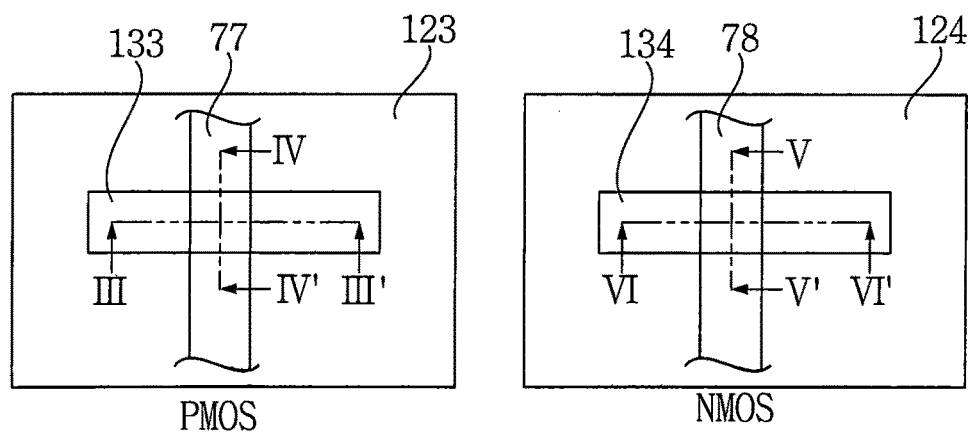
FIG. 25 is a layout for describing a method of forming a semiconductor device in accordance with another embodiment of the inventive concepts.

FIG. 25 is a layout for describing a method of forming a semiconductor device in accordance with another embodiment of the inventive concepts, and FIGS. 26 to 44 are cross-sectional views taken along lines III-III', IV-IV', V-V', and VI-VI' of FIG. 25 for describing the method of forming a semiconductor device in accordance with another embodiment of the inventive concepts.

Figure 26:
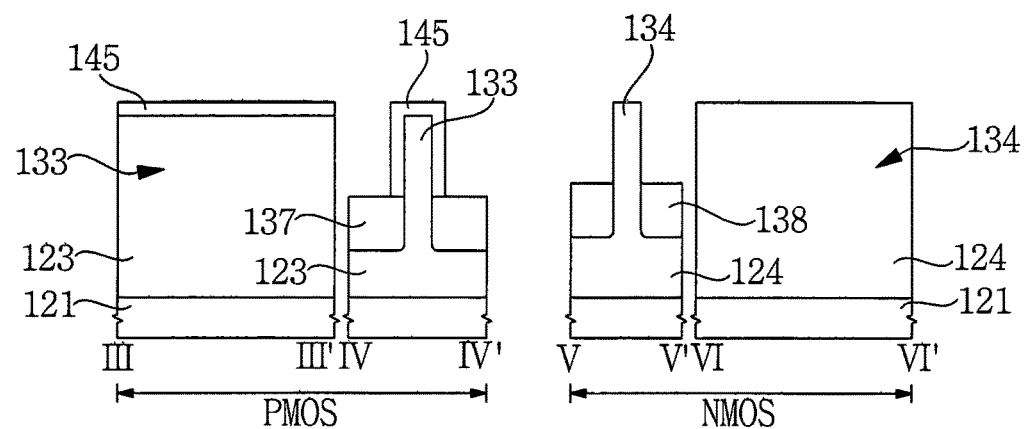
FIGS. 26 to 44 are cross-sectional views for describing the method of forming a semiconductor device in accordance with another embodiment of the inventive concepts.

Referring to FIGS. 25 and 26, an N-well 123, a P-well 124, a first fin active region 133, a second fin active region 134, a first device isolation layer 137, a second device isolation layer 138, and a semiconductor layer 145 may be formed on a semiconductor substrate 121 having an NMOS region and a PMOS region. The semiconductor substrate 121, the N-well 123, the P-well 124, the first fin active region 133, the second fin active region 134, the first device isolation layer 137, the second device isolation layer 138, and the semiconductor layer 145 may be formed by a similar method described with reference to FIGS. 5 to 24.

Figure 27:
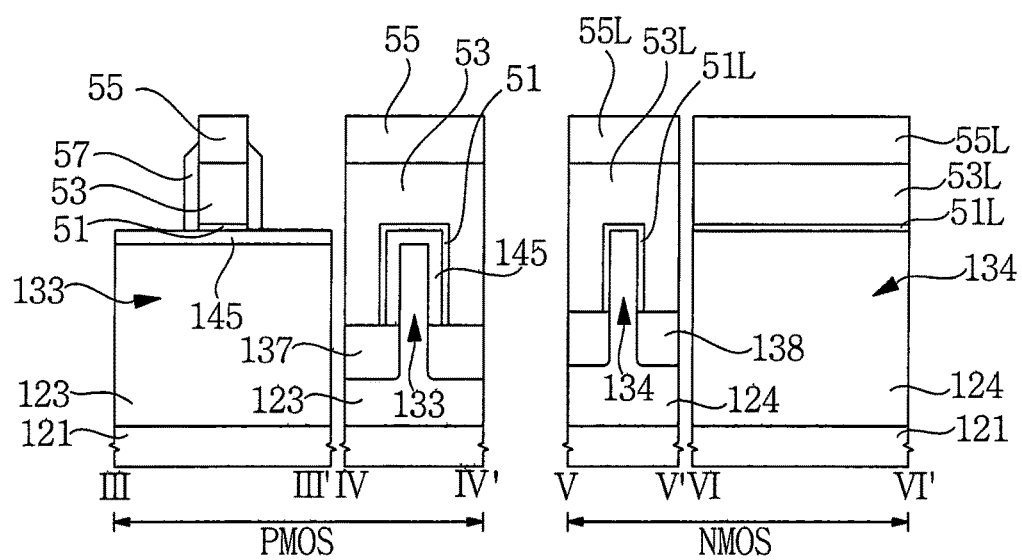

Referring to FIGS. 25 and 27, a preliminary buffer layer 51L, a preliminary gate layer 53L, and a preliminary capping layer 55L may be sequentially formed on the semiconductor substrate 121. The preliminary buffer layer 51L may include silicon oxide. The preliminary gate layer 53L may include polysilicon. The preliminary capping layer 55L may include silicon oxide, silicon nitride and/or silicon oxy-nitride.

A first preliminary buffer pattern 51, a first preliminary gate pattern 53, and a first preliminary capping pattern 55 may be formed by patterning the preliminary buffer layer 51L, the preliminary gate layer 53L, and the preliminary capping layer 55L in the PMOS region. The first preliminary gate pattern 53 may be on, and in some embodiments cover, an upper portion and side surfaces of the semiconductor layer 145 and extend to the first device isolation layer 137. The first preliminary buffer pattern 51 may remain between the first preliminary gate pattern 53 and the semiconductor layer 145.

The preliminary buffer layer 51L, the preliminary gate layer 53L, and the preliminary capping layer 55L may remain in the NMOS region.

First inner spacers 57 may be formed on side surfaces of the first preliminary gate pattern 53. The formation of the first inner spacers 57 may include a thin layer forming process and an anisotropic etching process. The first inner spacers 57 may include an insulating layer formed of silicon oxide, silicon nitride and/or silicon oxy-nitride. For example, the first inner spacers 57 may include silicon nitride. The semiconductor layer 145 may be exposed on outer surfaces of the first preliminary gate pattern 53 and the first inner spacers 57.

Figure 28:
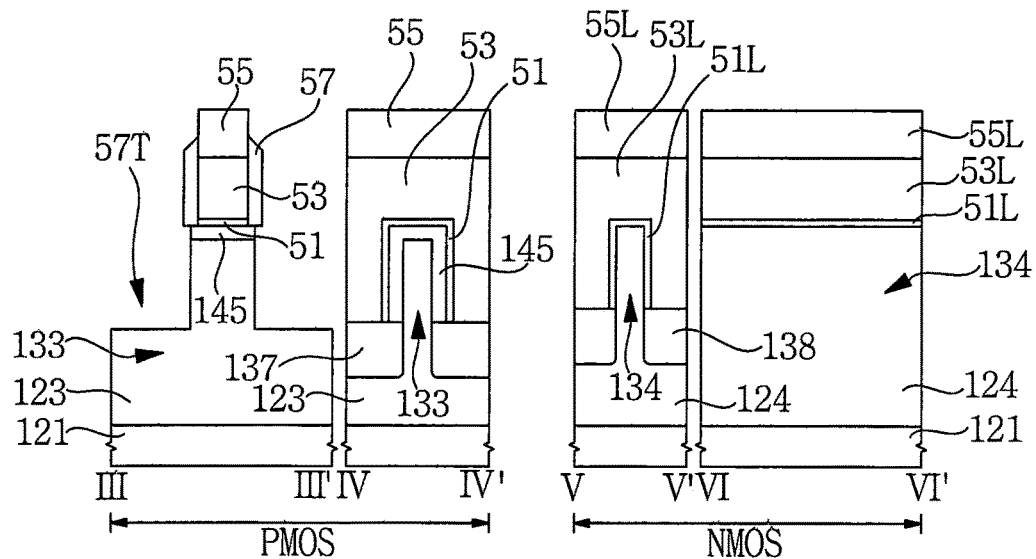

Referring to FIGS. 25 and 28, a first recessed area 57T may be formed by partially removing the semiconductor layer 145 and the first fin active region 133.

An anisotropic etching process, an isotropic etching process and/or a directional etching process may be applied in the formation of the first recessed area 57T. The first recessed area 57T may be aligned on outer surfaces of the first inner spacers 57. The first recessed area 57T may expand to a lower portion of the first inner spacer 57. A bottom of the first recessed area 57T may be formed at a level lower than a lower end of the first preliminary gate pattern 53. The semiconductor layer 145 and the first fin active region 133 may be exposed on sidewalls and a bottom of the first recessed area 57T. A bottom of the first inner spacer 57 may be exposed in the first recessed area 57T.

Figure 29:
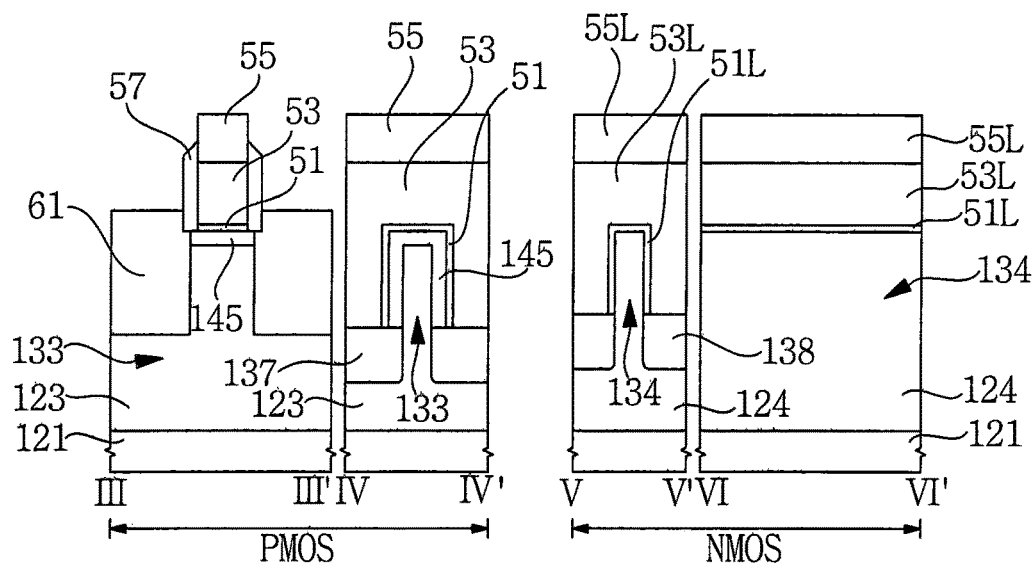

Referring to FIGS. 25 and 29, a first source/drain 61 may be formed in the first recessed area 57T. The first source/drain 61 may directly contact the semiconductor layer 145 and the first fin active region 133.

The first source/drain 61 may include a crystal growth material. The first source/drain 61 may include SiGe and/or Si. The first source/drain 61 may fill the first recessed area 57T and protrude at a level higher than an upper end of the semiconductor layer 145. The first source/drain 61 may be interpreted as an elevated source/drain. The first source/drain 61 may be interpreted as a stressor. The first source/drain 61 may include P-type impurities. The first source/drain 61 may include B and/or BF.

For example, the first source/drain 61 may include a SiGe layer formed by using a SEG method. An upper end of the first source/drain 61 may protrude at a level higher than a lower end of the first inner spacer 57. An amount of Ge contained in the first source/drain 61 may be in a range of approximately 0 to 50%. An amount of Ge contained in the first source/drain 61 may be different from an amount of Ge in the semiconductor layer 145. An amount of Ge contained in the first source/drain 61 may be less than an amount of Ge in the semiconductor layer 145. For example, an amount of Ge contained in the semiconductor layer 145 may be approximately 30%, and an amount of Ge contained in the first source/drain 61 may be in a range of approximately 10 to 30%.

In another embodiment, a first source/drain 61 may include a first lower semiconductor layer, a first middle semiconductor layer, and a first upper semiconductor layer. The first lower semiconductor layer may include an undoped single-crystalline SiGe formed by a SEG method. An amount of Ge contained in the first lower semiconductor layer may be in a range of approximately 10 to 25%. The first lower semiconductor layer may conformally extend on, and in some embodiments cover, an inner wall of the first recessed area 57T. The first middle semiconductor layer may be formed on the first lower semiconductor layer. The first middle semiconductor layer may completely fill the first recessed area 57T. An upper end of the first middle semiconductor layer may protrude at a level higher than an upper end of the semiconductor layer 145. The first middle semiconductor layer may include boron (B) doped single-crystalline Site formed by a SEG method. An amount of Ge contained in the first middle semiconductor layer may be in a range of approximately 25 to 50%. The first middle semiconductor layer may contain boron (B) in a range of approximately 1E20 to 3E20 atom/cm3. The first upper semiconductor layer may be formed on the first middle semiconductor layer. The first upper semiconductor layer may include boron (B) doped single-crystalline Si formed by a SEG method. The first upper semiconductor layer may contain boron (B) in a range of approximately 1E20 to 3E20 atom/cm$^3$.

Figure 30:
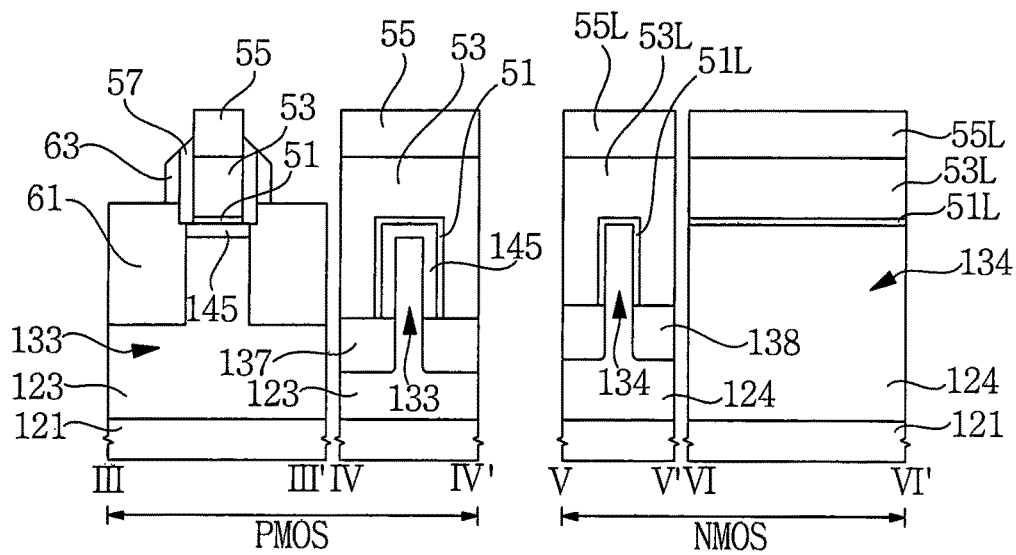

Referring to FIGS. 25 and 30, first outer spacers 63 may be formed on side surfaces of the first inner spacers 57. Bottoms of the first outer spacers 63 may contact upper surfaces of the first source/drain 61. The formation of the first outer spacers 63 may include a thin layer forming process and an anisotropic etching process. The first outer spacers 63 may include an insulating layer formed of silicon oxide, silicon nitride and/or silicon oxy-nitride. For example, the first outer spacers 63 may include silicon nitride.

Figure 31:
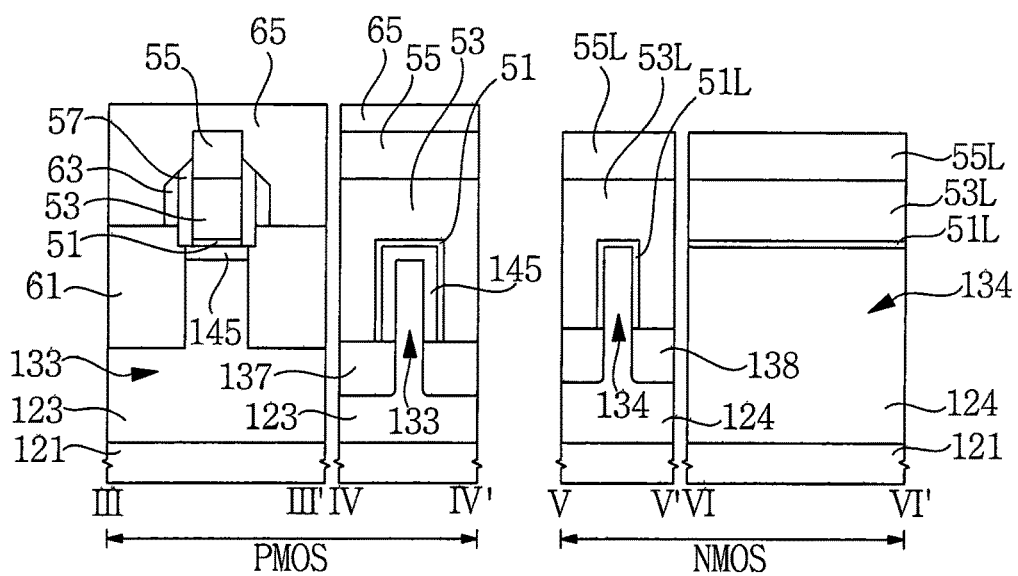

Referring to FIGS. 25 and 31, a first lower insulating layer 65 may be formed on the first source/drain 61. The first lower insulating layer 65 may include an insulating layer formed of silicon oxide, silicon nitride and/or silicon oxy-nitride. For example, the first lower insulating layer 65 may include silicon oxide.

Figure 32:
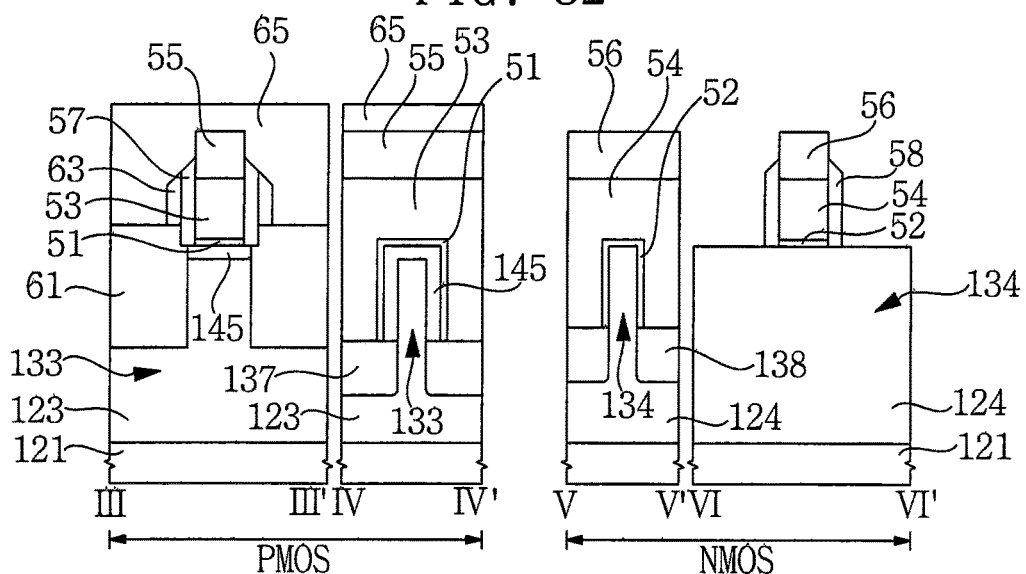

Referring to FIGS. 25 and 32, a second preliminary buffer pattern 52, a second preliminary gate pattern 54, and a second preliminary capping pattern 56 may be formed by patterning the preliminary buffer layer 51L, the preliminary gate layer 53L, and the preliminary capping layer 55L in the NMOS region. The second preliminary gate pattern 54 may be on, and in some embodiments cover, an upper portion and side surfaces of the second fin active region 134 and extend to the second device isolation layer 138. The second preliminary buffer pattern 52 may remain between the second preliminary gate pattern 54 and the second fin active region 134.

Second inner spacers 58 may be formed on side surfaces of the second preliminary gate pattern 54. The formation of the second inner spacers 58 may include a thin layer forming process and an anisotropic etching process. The second inner spacers 58 may include an insulating layer formed of silicon oxide, silicon nitride and/or silicon oxy-nitride. For example, the second inner spacers 58 may include silicon nitride. The second fin active region 134 may be exposed on outer surfaces of the second preliminary gate pattern 54 and the second inner spacers 58.

Figure 33:
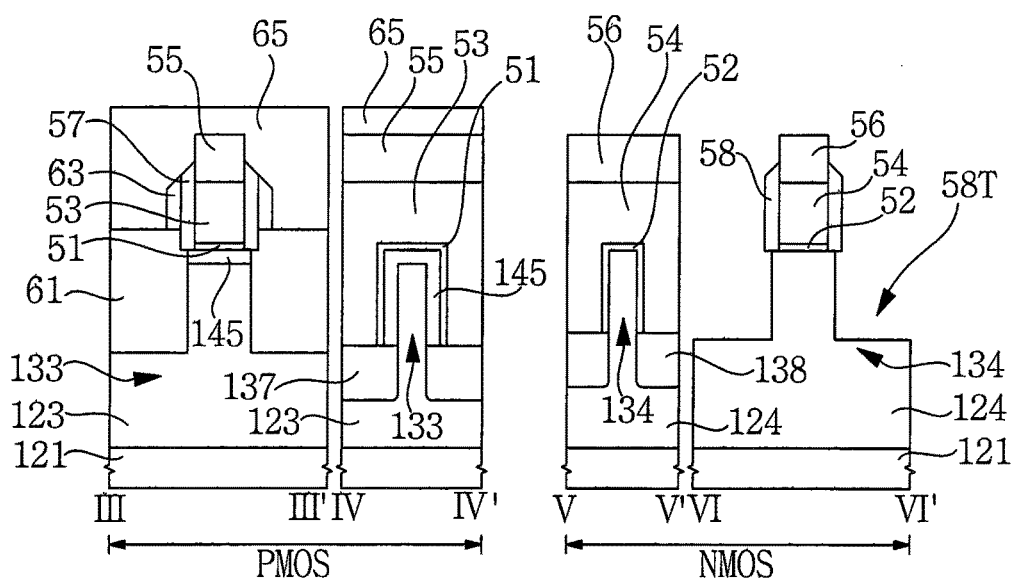

Referring to FIGS. 25 and 33, second recessed areas 58T may be formed by partially removing the second fin active region 134.

An anisotropic etching process, an isotropic etching process and/or a directional etching process may be applied in the formation of the second recessed areas 58T. The second recessed areas 58T may be aligned on outer surfaces of the second inner spacers 58. The second recessed areas 58T may be expanded to a lower portion of the second inner spacers 58. A bottom of the second recessed area 58T may be formed at a level lower than a lower end of the second preliminary gate pattern 54. The second fin active region 134 may be exposed on sidewalls and bottoms of the second recessed areas 58T. A bottom of the second inner spacer 58 may be exposed in the second recessed area 58T.

Figure 34:
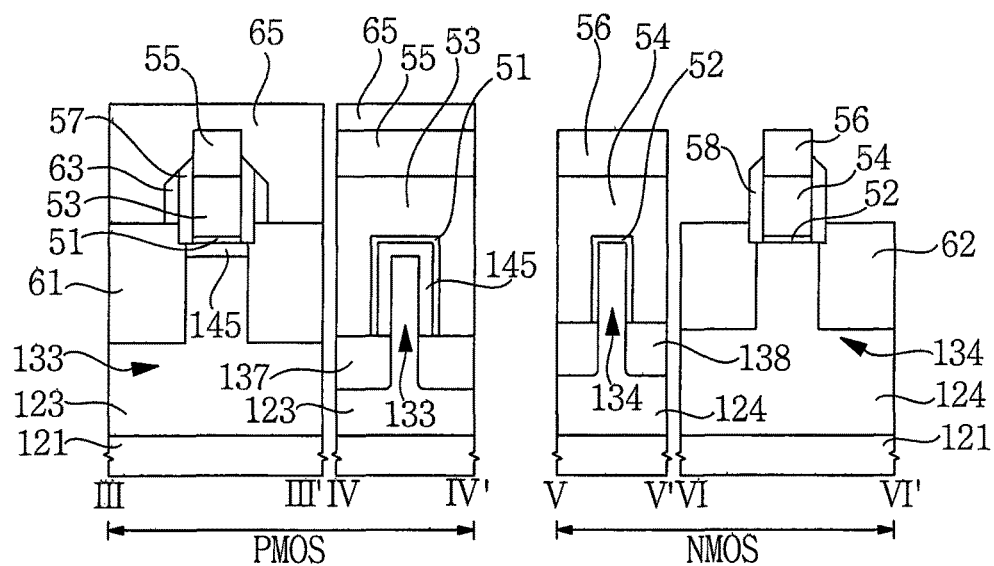

Referring to FIGS. 25 and 34, a second source/drain 62 may be formed in the second recessed area 58T.

The second source/drain 62 may include a crystal growth material. The second source/drain 62 may include SiC, Si, or a combination thereof. The second source/drain 62 may fill the second recessed areas 58T and protrude at a level higher than an upper end of the second fin active region 134. The second source/drain 62 may be referred to as an elevated source/drain. The second source/drain 62 may be interpreted as a stressor. The second source/drain 62 may include N-type impurities. The second source/drain 62 may include P and/or As.

For example, the second source/drain 62 may include a SiC layer formed by using a SEG method. An upper end of the second source/drain 62 may protrude at a level higher than a lower end of the second inner spacer 58.

In another embodiment, the second source/drain 62 may include a second lower semiconductor pattern and a second upper semiconductor layer. The second lower semiconductor pattern may be formed by implanting N-type impurities in the second fin active region 134. The second upper semiconductor layer may be formed on the second lower semiconductor pattern using a SEG method. The second upper semiconductor layer may include a Si layer. The second upper semiconductor layer may include N-type impurities.

Figure 35:
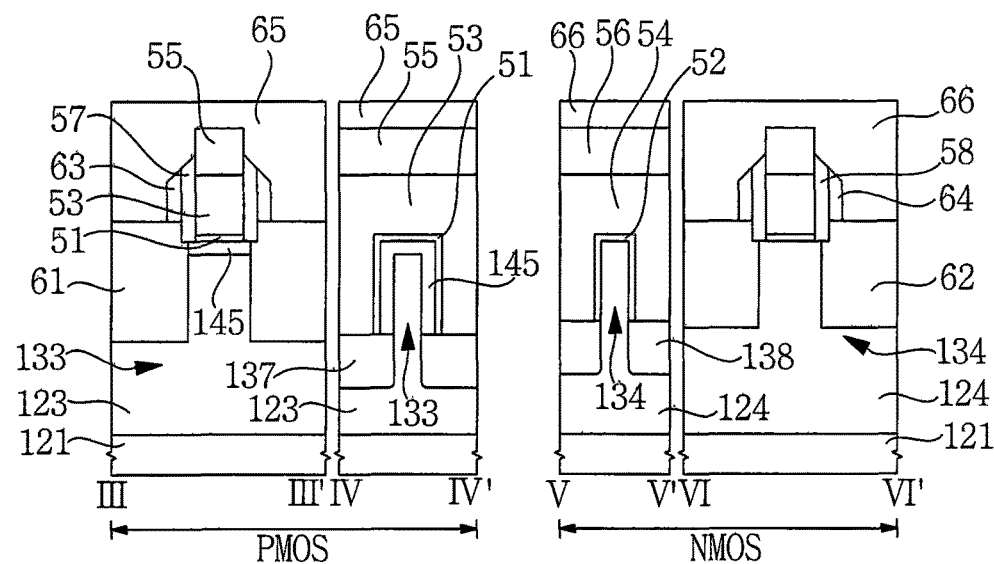

Referring to FIGS. 25 and 35, second outer spacers 64 may be formed on side surfaces of the second inner spacers 58. Bottoms of the second outer spacers 64 may contact an upper surface of the second source/drain 62. The formation of the second outer spacers 64 may include a thin layer forming process and an anisotropic etching process. The second outer spacers 64 may include an insulating layer formed of silicon oxide, silicon nitride and/or silicon oxy-nitride. For example, the second outer spacers 64 may include silicon nitride. The upper surface of the second source/drain 62 may be exposed on outer surfaces of the second outer spacers 64.

A second lower insulating layer 66 may be formed on the second source/drain 62. The formation of the second lower insulating layer 66 may include a thin layer forming process and a planarization process. The planarization process may include a Chemical Mechanical Polishing (CMP) process and/or an etch-back process. The second lower insulating layer 66 may include an insulating layer formed of silicon oxide, silicon nitride and/or silicon oxy-nitride. For example, the second lower insulating layer 66 may include silicon oxide.

Figure 36:
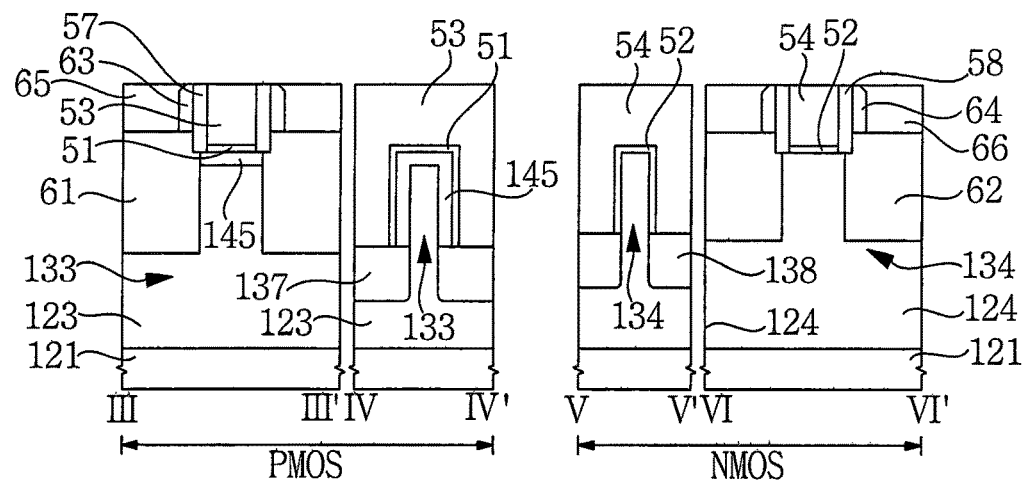

Referring to FIGS. 25 and 36, the first preliminary gate pattern 53 and the second preliminary gate pattern 54 may be exposed using a CMP process. The first preliminary capping pattern 55 and the second preliminary capping pattern 56 may be removed.

Figure 37:
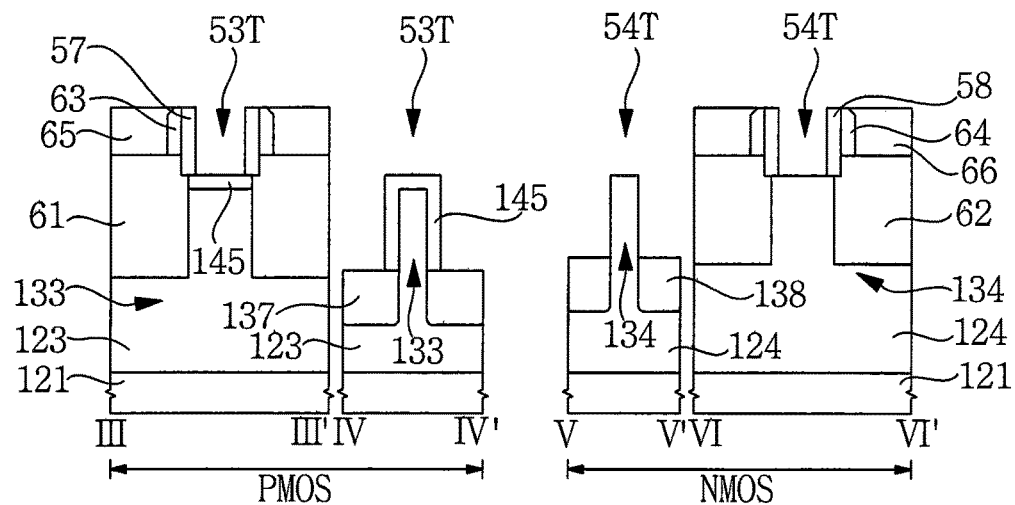

Referring to FIGS. 25 and 37, first gate trenches 53T and second gate trenches 54T may be formed by removing the first preliminary gate pattern 53, the second preliminary gate pattern 54, the first preliminary buffer pattern 51, and the second preliminary buffer pattern 52. An upper surface and side surfaces of the semiconductor layer 145 may be exposed in the first gate trench 53T. An upper surface and side surfaces of the second fin active region 134 may be exposed in the second gate trench 54T.

Figure 38:
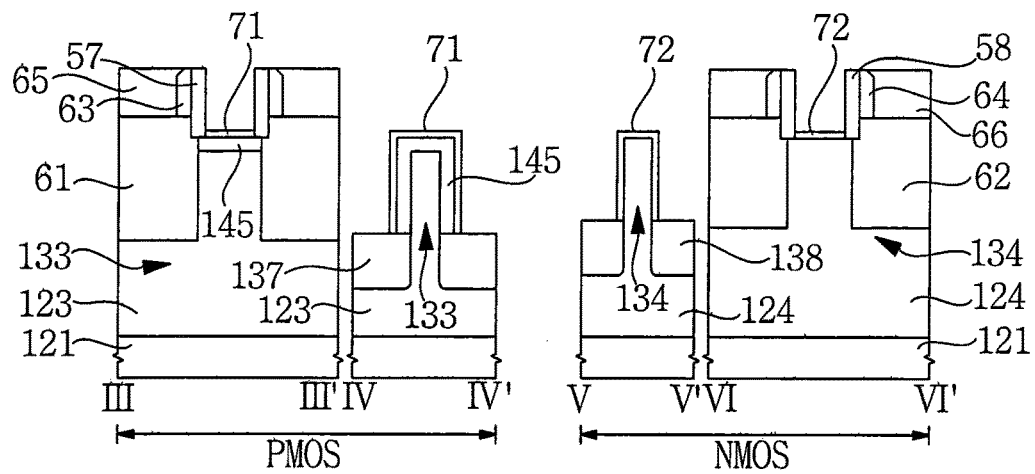

Referring to FIGS. 25 and 38, a first lower gate dielectric layer 71 and a second lower gate dielectric layer 72 may be formed. The first lower gate dielectric layer 71 may be formed on an upper surface and side surfaces of the semiconductor layer 145. The first lower gate dielectric layer 71 may be defined on the upper surface and the side surfaces of the semiconductor layer 145. The second lower gate dielectric layer 72 may be formed on an upper surface and side surfaces of the second fin active region 134. The second lower gate dielectric layer 72 may be defined on the upper surface and the side surfaces of the second fin active region 134.

The first lower gate dielectric layer 71 and the second lower gate dielectric layer 72 may be referred to as an interfacial oxide layer or a chemical oxide layer. The first lower gate dielectric layer 71 and the second lower gate dielectric layer 72 may be formed by performing a cleaning process. For example, the first lower gate dielectric layer 71 and the second lower gate dielectric layer 72 may include silicon oxide formed by a chemical reaction of Si and $H_2O_2$.

Figure 39:
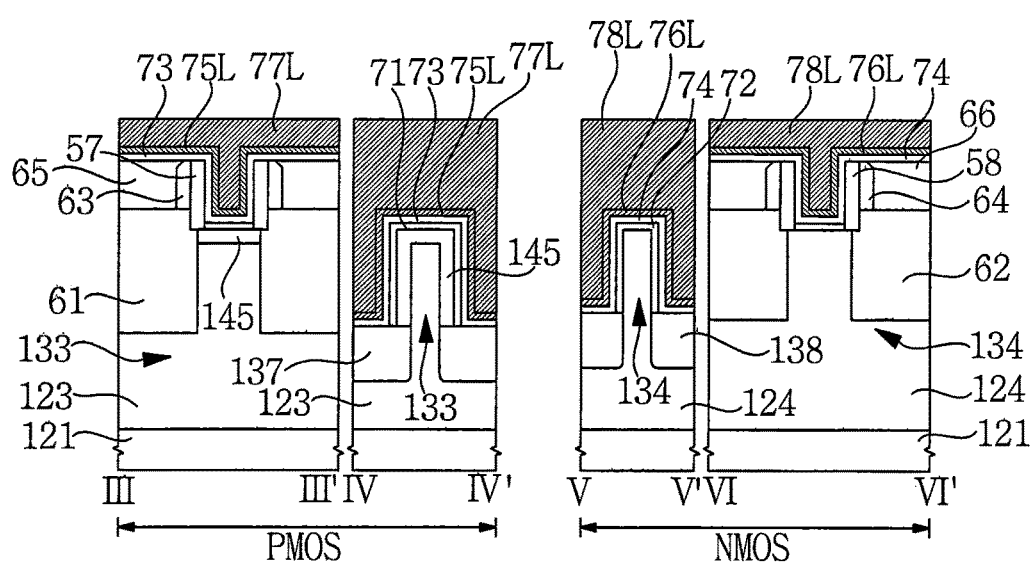

Referring to FIGS. 25 and 39, a first upper gate dielectric layer 73, a first lower gate electrode layer 75L, and a first upper gate electrode layer 77L may be formed on the first lower gate dielectric layer 71. A second upper gate dielectric layer 74, a second lower gate electrode layer 76L, and a second upper gate electrode layer 78L may be formed on the second lower gate dielectric layer 72.

The first upper gate dielectric layer 73 and the second upper gate dielectric layer 74 may include silicon oxide, silicon nitride, silicon oxy-nitride and/or a high-K dielectric layer. For example, the first upper gate dielectric layer 73 and the second upper gate dielectric layer 74 may include HfO and/or HfSiO. Each of the first lower gate electrode layer 75L and the second lower gate electrode layer 76L may include a conductive layer having a work-function. Each of the first lower gate electrode layer 75L and the second lower gate electrode layer 76L may include TiN, TaN, TiAl and/or TiAlC. The first lower gate electrode layer 75L may include a material different from the second lower gate electrode layer 76L. The first upper gate electrode layer 77L and the second upper gate electrode layer 78L may include a metal layer, a metal silicide layer, a conductive carbon layer and/or a polysilicon layer.

Figure 40:
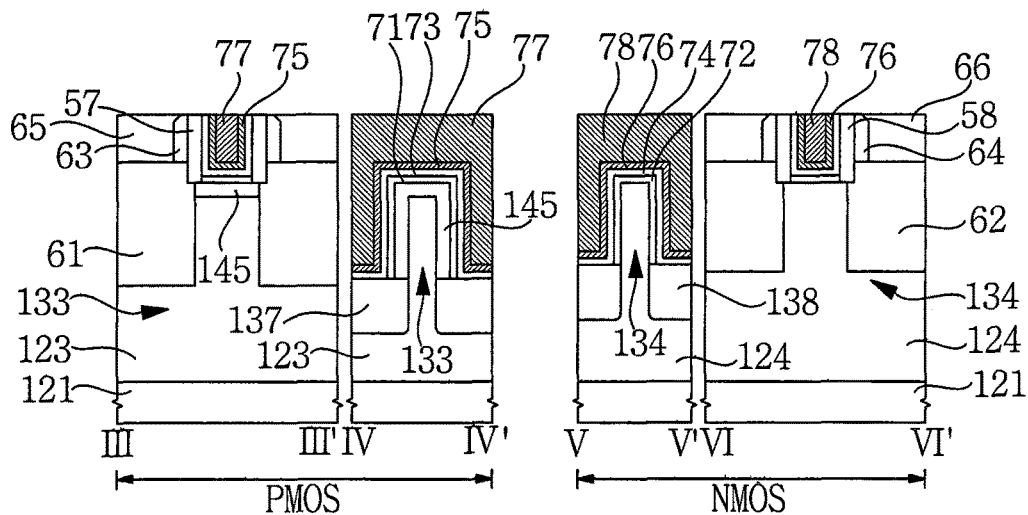

Referring to FIGS. 25 and 40, first lower gate electrodes 75, first upper gate electrodes 77, second lower gate electrodes 76, and second upper gate electrodes 78 may be formed using a planarization process.

The first lower gate electrodes 75 may surround side surfaces and a bottoms of the first upper gate electrodes 77.

The first upper gate dielectric layer 73 may surround side surfaces and bottoms of the first lower gate electrodes 75. The first lower gate dielectric layer 71 may be interposed between the semiconductor layer 145 and the first upper gate dielectric layer 73. The second lower gate electrodes 76 may surround side surfaces and bottoms of the second upper gate electrodes 78. The second upper gate dielectric layer 74 may surround side surface and bottoms of the second lower gate electrode 76. The second lower gate dielectric layer 72 may be interposed between the second fin active region 134 and the second upper gate dielectric layer 74.

In accordance with embodiments of the inventive concepts, an upper end of the first fin active region 133 may be formed at a level lower than an upper end of the second fin active region 134. An upper end of the semiconductor layer 145 may be formed at substantially the same level as the upper end of the second fin active region 134. Upper surfaces of the first lower insulating layer 65, the second lower insulating layer 66, the first upper gate electrode 77, and the second upper gate electrode 78 may be exposed in substantially the same plane.

Figure 41:
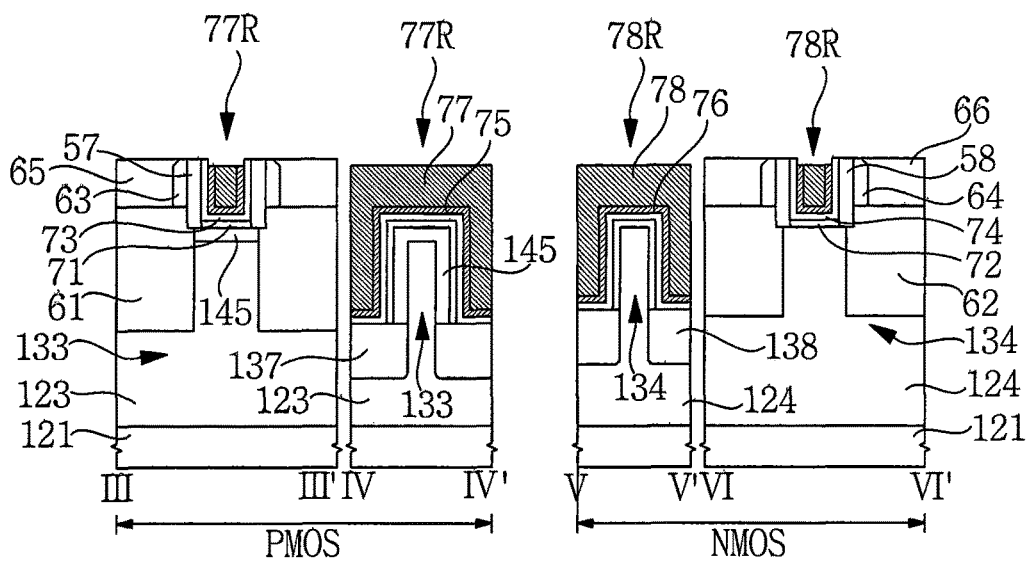

Referring to FIGS. 25 and 41, first gate recessed areas 77R and second gate recessed areas 78R may be formed by performing an etch-back process to the first lower gate electrode 75, the first upper gate electrode 77, the second lower gate electrode 76, and the second upper gate electrode 78.

Figure 42:
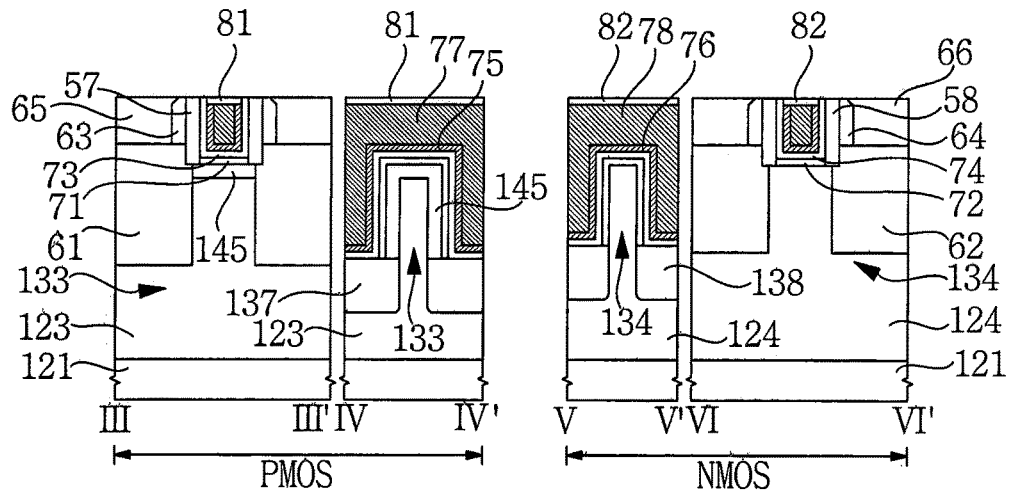

Referring to FIGS. 25 and 42, a first gate capping layer 81 and a second gate capping layer 82 may be formed in the first gate recessed area 77R and the second gate recessed area 78R. The first gate capping layer 81 and the second gate capping layer 82 may include an insulating layer formed of silicon oxide, silicon nitride and/or silicon oxy-nitride. For example, the first gate capping layer 81 and the second gate capping layer 82 may include silicon nitride.

Figure 43:
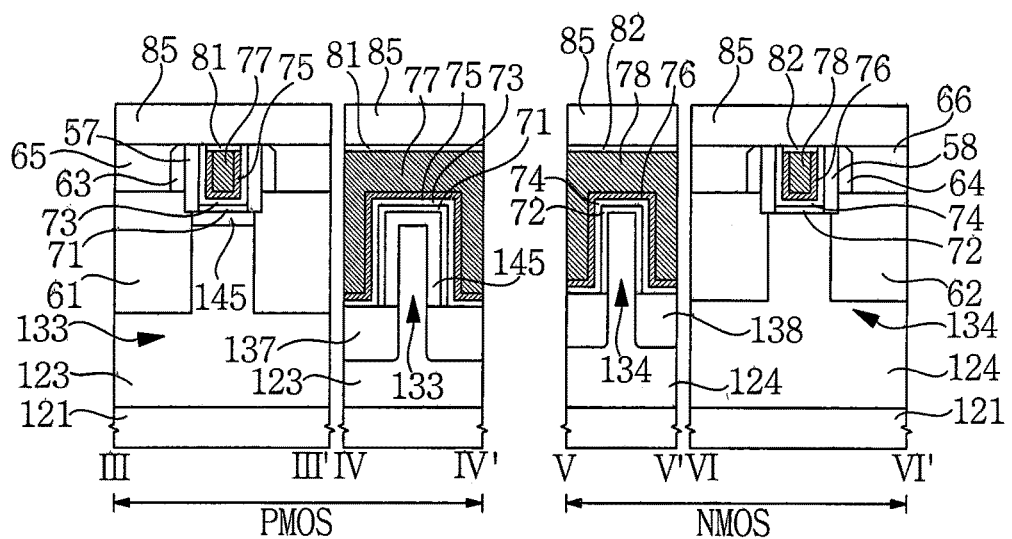

Referring to FIGS. 25 and 43, an upper insulating layer 85 on, and in some embodiments covering, the PMOS region and the NMOS region may be formed. The upper insulating layer 85 may include an insulating layer formed of silicon oxide, silicon nitride and/or silicon oxy-nitride. For example, the upper insulating layer 85 may include silicon oxide.

Figure 44:
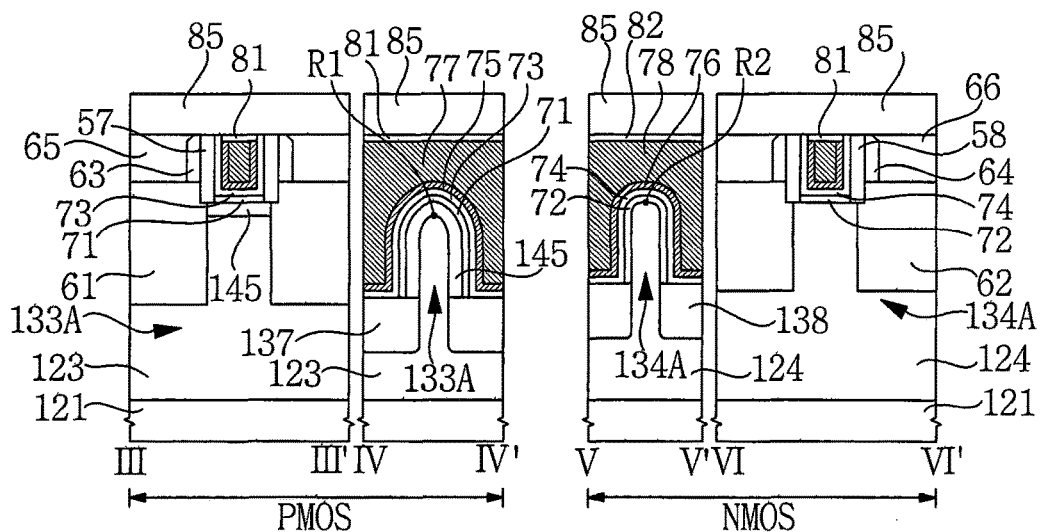

Referring to FIGS. 25 and 44, an upper end of a first fin active region 133A may have a shape different from an upper end of a second fin active region 134A. The upper end of the first fin active region 133A may be roundly formed. The upper end of the first fin active region 133A may have a first radius of curvature R1. The upper end of the second fin active region 134A may be roundly formed. The upper end of the second fin active region 134A may have a second radius of curvature R2. The first radius of curvature R1 may be smaller than the second radius of curvature R2.

Figure 45:
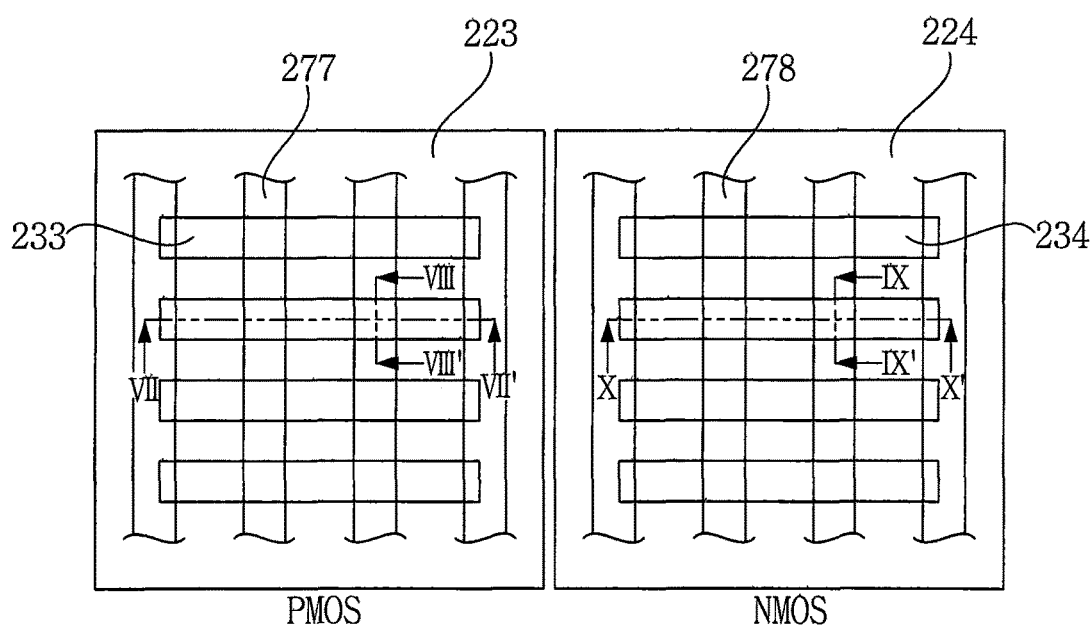
FIG. 45 is a layout for describing a method of forming a semiconductor device in accordance with still another embodiment of the inventive concepts.
Figure 46:
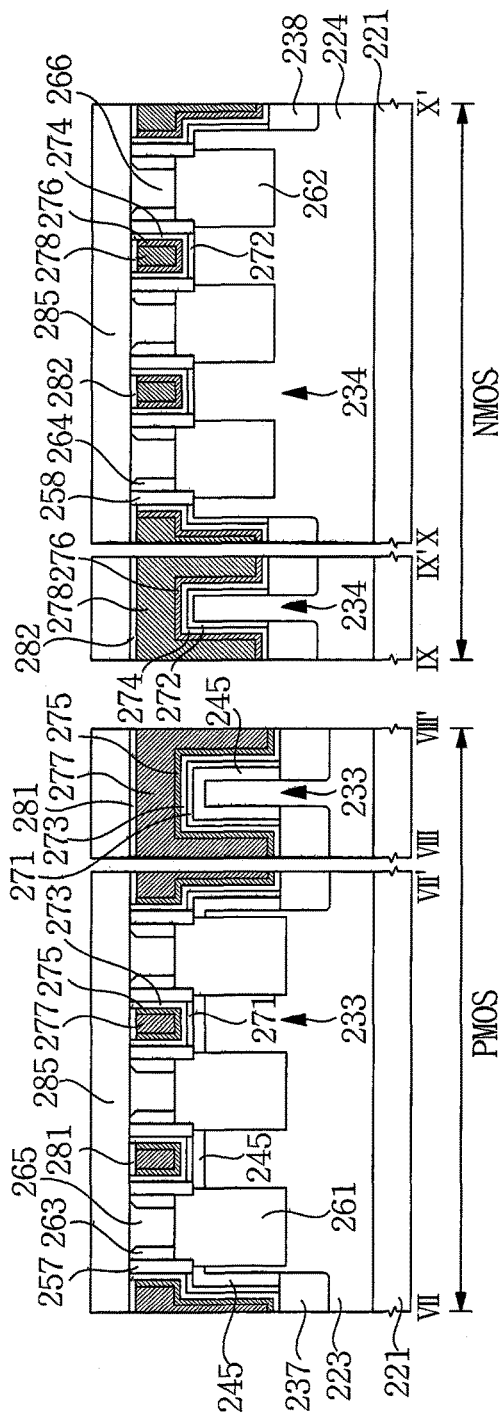
FIGS. 46 and 47 are cross-sectional views for describing the method of forming a semiconductor device in accordance with still another embodiment of the inventive concepts.
Figure 47:
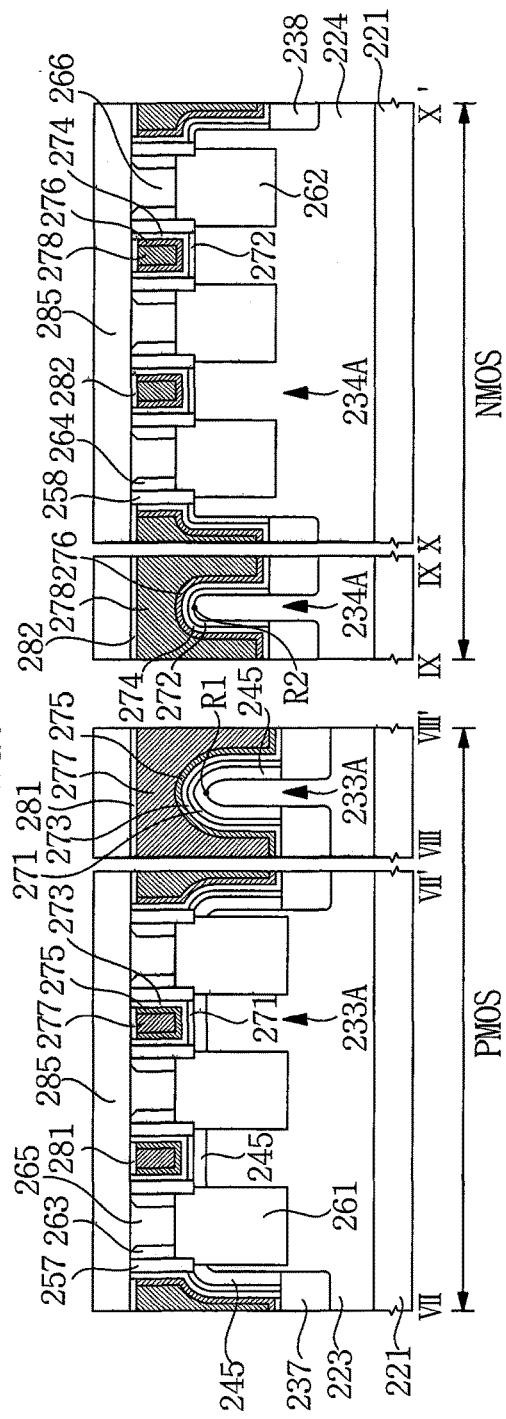

FIG. 45 is a layout for describing a method of forming a semiconductor device in accordance with still another embodiment of the inventive concepts, and FIGS. 46 and 47 are cross-sectional views taken along lines VII-VII', VIII-VIII', IX-IX' and X-X' of FIG. 45 for describing the method of forming a semiconductor device in accordance with still another embodiment of the inventive concepts.

Referring to FIGS. 45 and 46, an N-well 223, a P-well 224, a plurality of first fin active regions 233, a plurality of second fin active regions 234, a first device isolation layer 237, a second device isolation layer 238, a semiconductor layer 245, first inner spacers 257, second inner spacers 258, first source/drains 261, second source/drains 262, first outer spacers 263, second outer spacers 264, a first lower insulating layer 265, a second lower insulating layer 266, a first lower gate dielectric layer 271, a second lower gate dielectric layer 272, a first upper gate dielectric layer 273, a second upper gate dielectric layer 274, a plurality of first lower gate electrodes 275, a plurality of second lower gate electrodes 276, a plurality of first upper gate electrodes 277, a plurality of second upper gate electrodes 278, a first gate capping layer 281, a second gate capping layer 282, and an upper insulating layer 285 may be formed on a semiconductor substrate 221 having an NMOS region and a PMOS region.

The plurality of first fin active regions 233 may extend in parallel. The plurality of second fin active regions 234 may extend in parallel. The plurality of first upper gate electrodes 277 may extend in parallel. The plurality of second upper gate electrodes 278 may extend in parallel. Each of the plurality of first upper gate electrodes 277 may cross the plurality of first fin active regions 233. Each of the plurality of second upper gate electrodes 278 may cross the plurality of second fin active regions 234.

Referring to FIGS. 45 and 47, upper ends of first fin active regions 233A may have shapes different from upper ends of second fin active regions 234A. An upper end of each of the first fin active regions 233A may have a first radius of curvature R1. An upper end of each of the second fin active regions 234A may have a second radius of curvature R2. The first radius of curvature R1 may be smaller than the second radius of curvature R2.

Figure 48:
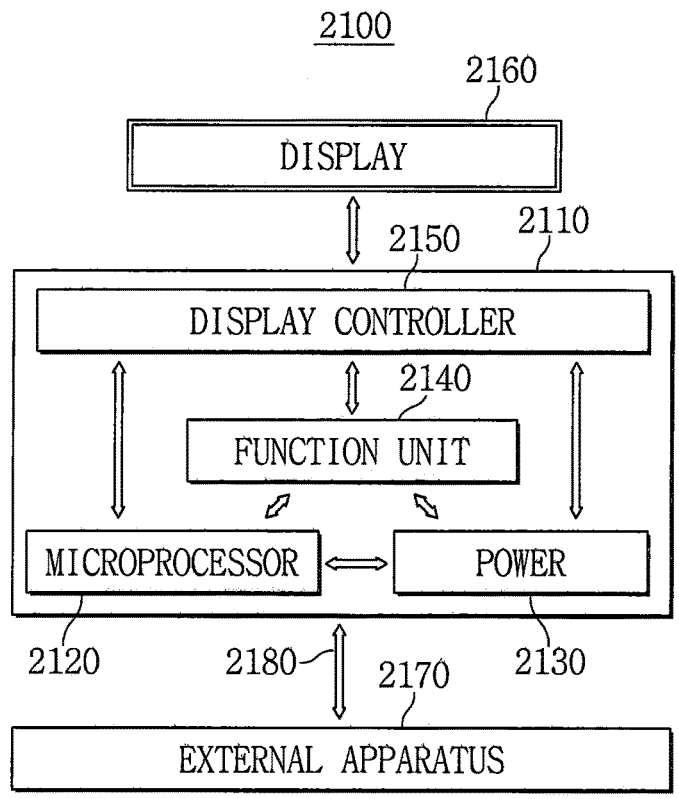
FIGS. 48 and 49 are system block diagrams of electronic devices in accordance with an embodiment of the inventive concepts.
Figure 49:
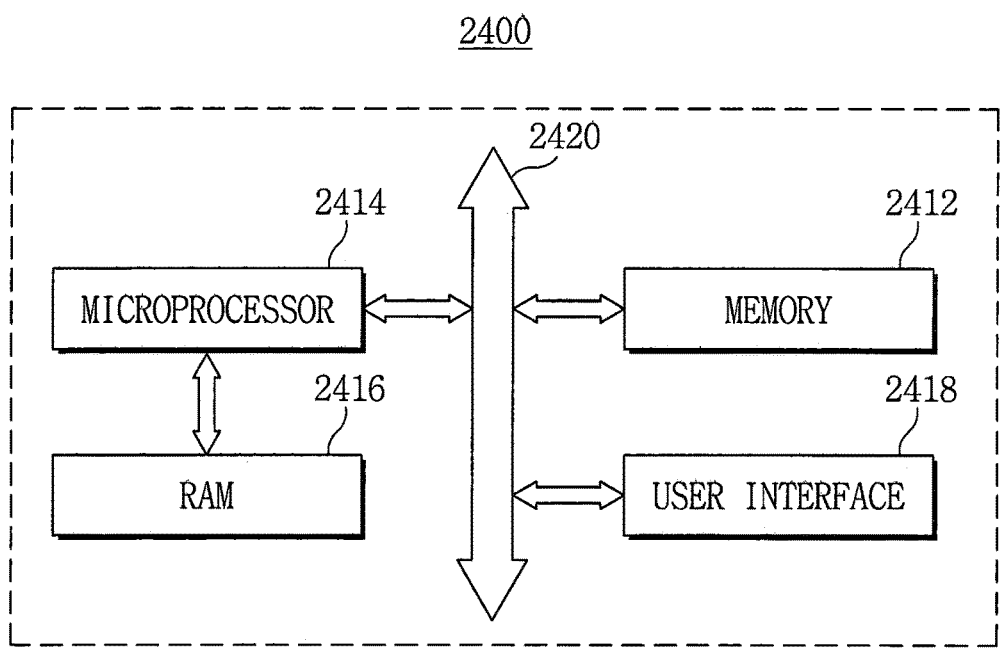

FIGS. 48 and 49 are system block diagrams of electronic devices in accordance with an embodiment of the inventive concepts.

Referring to FIG. 48, a semiconductor device similar to descriptions with reference to FIGS. 1 to 47 may be applied to an electronic system 2100. The electronic system 2100 may include a body 2110, a microprocessor 2120, a power 2130, a function unit 2140, and a display controller 2150. The body 2110 may include a motherboard formed with a printed circuit board (PCB). The body 2110 may include the microprocessor 2120, the power 2130, the function unit 2140, and the display controller 2150. A display 2160 may be disposed inside the body 2110 or outside the body 2110. For example, the display 2160 may be disposed on a surface of the body 2110 and display an image processed by the display controller 2150.

The power 2130 may receive a predetermined voltage from an external battery, divide the predetermined voltage into required voltage levels, and serve to supply the voltages to the microprocessor 2120, the function unit 2140, and the display controller 2150. The microprocessor 2120 may receive a voltage from the power 2130 and control the function unit 2140 and the display 2160. The function unit 2140 may perform various functions of the electronic system 2100. For example, when the electronic system 2100 is a smart phone, the function unit 2140 may include dialing or various components to perform mobile functions such as an image output to the display 2160 or an audio output to a speaker from communication with an external apparatus 2170, and the function unit 2140 may also serve as a camera image processor when a camera is mounted on the smart phone.

In an application embodiment, when the electronic system 2100 includes a memory card or the like to expand a storage capacity, the function unit 2140 may serve as a memory card controller. The function unit 2140 may exchange a signal with the external apparatus 2170 via either a wired or wireless communication unit 2180. Furthermore, when the electronic system 2100 requires a Universal Serial Bus (USB) or the like to expand functions, the function unit 2140 may serve as an interface controller. In addition, the function unit 2140 may include a mass capacity storage unit.

A semiconductor device similar to those described with reference to FIGS. 1 to 47 may apply to the function unit 2140, the microprocessor 2120 and/or any of the other blocks of FIG. 48. For example, the microprocessor 2120 may include the first fin active region 133 and the semiconductor layer 145.

Referring to FIG. 49, an electronic system 2400 may include at least one of the semiconductor devices according to the embodiments of the inventive concepts. The electronic system 2400 may provide a component of a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may be mutually connected via the bus 2420. The user interface 2418 may be used for data input to the electronic system 2400 or data output from the electronic system 2400. The microprocessor 2414 may program and control the electronic system 2400. The RAM 2416 may be used as an operational memory of the microprocessor 2414. The microprocessor 2414, the RAM 2416 and/or other components may be assembled in a single package. The memory system 2412 may store operational codes of the microprocessor 2414, data processed by the microprocessor 2414, or externally input data. The memory system 2412 may include a controller and a memory.

A semiconductor device similar to those described with reference to FIGS. 1 to 47 may apply to the microprocessor 2414, the RAM 2416, the memory system 2412 and/or the user interface 2418.

In accordance with embodiments of the inventive concepts, a first active region defined in a PMOS region and a second active region defined in an NMOS region are formed. A semiconductor layer is formed on the first active region. A first gate electrode on the semiconductor layer and a second gate electrode on the second active region are formed. An upper end of the first active region is formed at a level lower than an upper end of the second active region. An upper end of the semiconductor layer may be formed at substantially the same horizontal level as the upper end of the second active region. A process is simplified and heights of the first gate electrode and the second gate electrode may be formed at certain levels.

The foregoing is illustrative of embodiments of the inventive concepts with reference to the accompanying drawings. Although a number of embodiments have been described, those of ordinary skill in the art will readily understand that many modifications are possible in embodiments without materially departing from the novel teachings and advantages. Therefore, it is to be understood that the foregoing is illustrative of various embodiments and is not to be construed as limited to the specific embodiments disclosed.

What is claimed is:

1. A semiconductor device, comprising:
 a substrate having a PMOS region and an NMOS region;
 a first active region in the PMOS region;
 a second active region in the NMOS region;
 a semiconductor layer on the first active region;
 a first gate electrode configured to cross the first active region and extend on the semiconductor layer; and
 a second gate electrode on the second active region,
 wherein an upper end of the first active region extends to a level lower than an upper end of the second active region but higher than a lower end of the second active region, and a lower end of the first active region extends to a level lower than the lower end of the second active region.

2. The semiconductor device of claim 1, wherein an upper end of the semiconductor layer extends to a same horizontal level as the upper end of the second active region.

3. The semiconductor device of claim 1, wherein upper ends of the first gate electrode and the second gate electrode extend to the same horizontal level.

4. The semiconductor device of claim 1, wherein the upper end of the first active region has a shape different from the upper end of the second active region.

5. The semiconductor device of claim 1, wherein the upper end of the first active region has a first radius of curvature, and the upper end of the second active region has a second radius of curvature, wherein the first radius of curvature is smaller than the second radius of curvature.

6. The semiconductor device of claim 1, wherein the first active region has a height greater than a width thereof and a lower end of the first gate electrode extends to a level lower than the upper end of the first active region, and the second active region has a height greater than a width thereof and a lower end of the second gate electrode extends to a level lower than the upper end of the second active region.

7. The semiconductor device of claim 6, further comprising:
 a gate dielectric layer that is on a bottom and a side surface of the first gate electrode,
 wherein an upper end of the gate dielectric layer extends to a level higher than a center of the first gate electrode.

8. The semiconductor device of claim 1, further comprising:
 a first device isolation layer on a side surface of the first active region; and
 a second device isolation layer on a side surface of the second active region, wherein a lower end of the first device isolation layer extends to a level lower than a lower end of the second device isolation layer.

9. The semiconductor device of claim 8, wherein an upper end of the first device isolation layer extends to a level lower than an upper end of the second device isolation layer.

10. The semiconductor device of claim 8, wherein a lower end of the semiconductor layer extends to a level higher than the first device isolation layer.

11. A semiconductor device, comprising:
 a substrate;
 a first fin on the substrate;
 a second fin on the substrate;
 a semiconductor layer on the first fin;
 a first gate electrode on the semiconductor layer; and
 a second gate electrode on the second fin,
 wherein an upper end of the first fin is located at a level between an upper end of the second fin and a lower end of the second fin, and
 wherein a lower end of the first fin is located at a level lower than the lower end of the second fin.

12. The semiconductor device of claim 11, wherein an upper end of the semiconductor layer is located at a same horizontal level as the upper end of the second fin.

13. The semiconductor device of claim 11, wherein the upper end of the first fin and the upper end of the second fin have different radii of curvature.

14. The semiconductor device of claim 13, wherein the upper end of the first fin has a first radius of curvature, and the upper end of the second fin has a second radius of curvature, wherein the first radius of curvature is smaller than the second radius of curvature.

15. The semiconductor device of claim 11, further comprising:
a first device isolation layer on a lower side surface of the first fin; and
a second device isolation layer on a lower side surface of the second fin,
wherein a lower end of the first device isolation layer is located at a level lower than a lower end of the second device isolation layer.

16. The semiconductor device of claim 15, wherein an upper end of the first device isolation layer is located at a level lower than an upper end of the second device isolation layer.

17. A semiconductor device, comprising:
a substrate having a PMOS region and an NMOS region;
a first fin in the PMOS region;
a second fin in the NMOS region;
a semiconductor layer on the first fin;
a first gate electrode configured to cross the first fin and extend on the semiconductor layer; and
a second gate electrode on the second fin,
wherein an upper end of the first fin extends to a level lower than an upper end of the second fin, and a lower end of the first fin extends to a level lower than a lower end of the second fin, and
wherein the upper end of the first fin and the upper end of the second fin have different radii of curvature.

18. The semiconductor device of claim 17, wherein the upper end of the first fin has a first radius of curvature, and the upper end of the second fin has a second radius of curvature,
wherein the first radius of curvature is smaller than the second radius of curvature.

19. The semiconductor device of claim 17, wherein the upper end of the first fin extends to a level higher than the lower end of the second fin.

20. The semiconductor device of claim 17, wherein an upper end of the semiconductor layer is located at a same horizontal level as the upper end of the second fin.

* * * * *